US006321831B1

(12) United States Patent
Tanaka et al.

(10) Patent No.: US 6,321,831 B1
(45) Date of Patent: Nov. 27, 2001

(54) COOLING APPARATUS USING BOILING AND CONDENSING REFRIGERANT

(75) Inventors: Hiroshi Tanaka; Tadayoshi Terao, both of Toyoake; Kiyoshi Kawaguchi, Toyota; Takahide Ohara, Okazaki; Akihiro Maeda; Eitaro Tanaka, both of Kariya, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/456,655

(22) Filed: Dec. 8, 1999

(30) Foreign Application Priority Data

Dec. 16, 1998 (JP) .................................................. 10-357381
Dec. 16, 1998 (JP) .................................................. 10-357594
Dec. 18, 1998 (JP) .................................................. 10-359958
Sep. 22, 1999 (JP) .................................................. 11-268740

(51) Int. Cl.[7] .................................................. F28D 15/00
(52) U.S. Cl. .............................. 165/104.33; 165/104.21; 165/174; 361/700; 257/715
(58) Field of Search ...................... 165/104.33, 104.21, 165/174; 361/700; 257/715

(56) References Cited

U.S. PATENT DOCUMENTS 5,998,863 * 12/1999 Kobayashi et al. ............. 165/104.33

FOREIGN PATENT DOCUMENTS 2000-156445    6/2000 (JP) .

* cited by examiner

Primary Examiner—Christopher Atkinson
(74) Attorney, Agent, or Firm—Harness, Dickey & Pierce, PLC

(57) ABSTRACT

A cooling apparatus includes a refrigerant tank containing boiling and condensing refrigerant and a radiator for cooling the refrigerant. The radiator is connected to the refrigerant tank on a front surface thereof, and hot objects to be cooled are attached to a heat-receiving surface formed on a rear surface of the refrigerant tank. The refrigerant is circulated in the apparatus so that the refrigerant is vaporized in the refrigerant tank and condensed in the radiator. The radiator is connected to the refrigerant tank by inserting a pair of header tanks thereof into the refrigerant tank. The insertion length is controlled to obtain good heat conductivity between the radiator and the refrigerant tank and to avoid deformation of a radiator fin contacting the refrigerant tank. Holes for mounting a substrate carrying the hot objects may be made on enlarged portions of a cover plate closing the refrigerant tank. The heat-receiving surface may be elevated from the rear surface of the refrigerant tank to avoid interference between other components mounted on the substrate and the rear surface of the refrigerant tank.

12 Claims, 24 Drawing Sheets

⇐ : LIQUID REFRIGERANT
⇐▦▦▦ : VAPOR REFRIGERANT

COOLING APPARATUS USING BOILING AND CONDENSING REFRIGERANT

CROSS-REFERENCE TO RELATED APPLICATIONS

This application is based upon and claims benefit of priority of Japanese Patent Applications No. Hei-10-357381 filed on Dec. 16, 1998, No. Hei-10-357594 filed on Dec. 16, 1998, No. Hei-10-359958 filed on Dec. 18, 1998, and No. Hei-11-268740 filed on Sep. 22, 1999, the contents of which are incorporated herein by reference.

BACKGROUND OF THE INVENTION

1. Field of the Invention

The present invention relates to a cooling apparatus for cooling hot objects attached thereto by vaporizing condensed liquid refrigerant.

2. Description of Related Art

A power unit cooler using boiling and condensing refrigerant has been known and used in an industrial field. Hot objects such as IGBTs attached to a heat-receiving surface of a tank containing refrigerant are cooled by evaporation latent heat of the refrigerant. The evaporated refrigerant is cooled down and condensed into liquid by radiating heat therefrom to cooling fluid such as cooling air. Since the hot objects such as IGBTs are packaged as a single unit, they can be easily attached to the unit cooler. However, if the hot objects are computer chips that are mounted on a printed board, other components mounted on the same printed board interfere with projected portions on the heat-receiving surface or on the refrigerant tank. It is, therefore, required to design the cooler unit so that no projected portions are formed on the side of the heat-receiving surface on which hot objects are attached.

SUMMARY OF THE INVENTION

The present invention has been made in view of the above-mentioned problem, and an object of the present invention is to provide an improved cooling apparatus on which hot objects are easily mounted, and more particularly to provide an improved structure of such an apparatus wherein a radiator is assembled to a refrigerant tank with a precise dimensional relation.

A cooling apparatus is composed of a refrigerant tank in which refrigerant is contained and evaporated and a radiator connected to the refrigerant tank for cooling and condensing the evaporated refrigerant. The refrigerant tank is a thin box having a front surface and a rear surface. The radiator is connected to the refrigerant tank from the front surface, and hot objects to be cooled such as computer chips are attached to a heat-receiving surface formed on the rear surface of the refrigerant tank. The refrigerant tank is positioned upright and the radiator is connected perpendicularly to the refrigerant tank. A duct for leading cooling fluid such as air therethrough is connected to the cooling apparatus, so that the radiator is cooled down by the cooling fluid.

The refrigerant heated and evaporated by heat of the hot objects flows into the radiator. The vaporized refrigerant is cooled down and condensed into liquid in the radiator, and the liquid refrigerant is supplied to the refrigerant tank. This circulation of the refrigerant is repeated, and thereby the hot objects are cooled down.

The radiator is composed of a pair of header tanks connected to the refrigerant tank, plural tubes connected between the tubes, and heat-radiation fins disposed between each pair of neighboring tubes. The header tanks are inserted into the refrigerant tank to connect the radiator to the refrigerant tank. If the header tanks are inserted too deep, the fin contacting the refrigerant tank deforms. On the other hand, if the insertion length is too small, the fin positioned closest to the refrigerant tank does not properly contact the refrigerant tank, thereby causing heat conduction efficiency to decrease. To properly control the insertion length, one or more shoulders abutting the refrigerant tank are formed on the header tanks. Alternatively, one or more spacers may be interposed between the header tanks and the refrigerant tank. Further, a recess for receiving the bottom end of the header tanks may be provided on the refrigerant tank.

The refrigerant tank is composed of a case and a cover plate that closes the front surface of the refrigerant tank. The cover plate may be made so that it extends beyond the upper and lower edges of the refrigerant tank, and holes for mounting a substrate carrying the hot objects may be formed through the extended portions of the cover plate. In this manner, the inner space of the refrigerant tank can be utilized more effectively, and resiliency of the extended portions help the hot objects to closely contact the heat-receiving surface. A resilient member such as a spring may be additionally used to further enhance the mounting resiliency. The duct for conducting cooling air may be formed integrally with the cover plate to simplify the whole structure of the cooling apparatus. The integrally formed duct also helps the cooling air to flow smoothly through the duct.

If the hot objects such as computer chips are small and other components mounted on the substrate stand relatively high on the substrate, the heat receiving surface may be made in a smaller size and may be elevated from the rear surface of the refrigerant tank to avoid interference between the components and the refrigerant tank. In this case, a vapor passage and the a liquid passage in the refrigerant tank are formed so that the liquid flow does not interfere with the vapor flow.

According to the present invention, the hot objects are easily attached to one surface of the refrigerant tank without being obstructed by other structures of the cooling apparatus. The radiator is connected to the refrigerant tank with a precise dimensional relation because the insertion length of the radiator is properly controlled. Moreover, the inner space of the refrigerant tank effectively utilized, and the hot objects are easily attached to the heat-receiving surface, even if the size of the hot objects are small and other components are mounted on the same substrate together with the hot objects.

Other objects and features of the present invention will become more readily apparent from a better understanding of the preferred embodiments described below with reference to the following drawings.

DETAILED DESCRIPTION OF THE PREFERRED EMBODIMENTS (First Embodiment)

Referring to FIGS. 1–18, a first embodiment of the present invention will be described. First referring to FIG. 1, a cooling apparatus 1 is composed of a refrigerant tank 4 in which boiling and condensing refrigerant flows and a radiator 4 that cools down and condenses the refrigerant flowing therethrough. The refrigerant tank 4 and the radiator 5 are assembled by inserting one end of the radiator 5 into the refrigerant tank 4 and by soldering both together. The refrigerant tank 4 has a front surface on which the radiator is disposed and a rear surface on which hot objects to be cooled are attached. Boiling and condensing liquid such as water, alcohol, fluorocarbon or the like is used as the refrigerant circulating in the cooling apparatus 1. Since the rear surface is flat and nothing is sticking out therefrom, the hot objects can be easily attached thereon.

Figure 2:
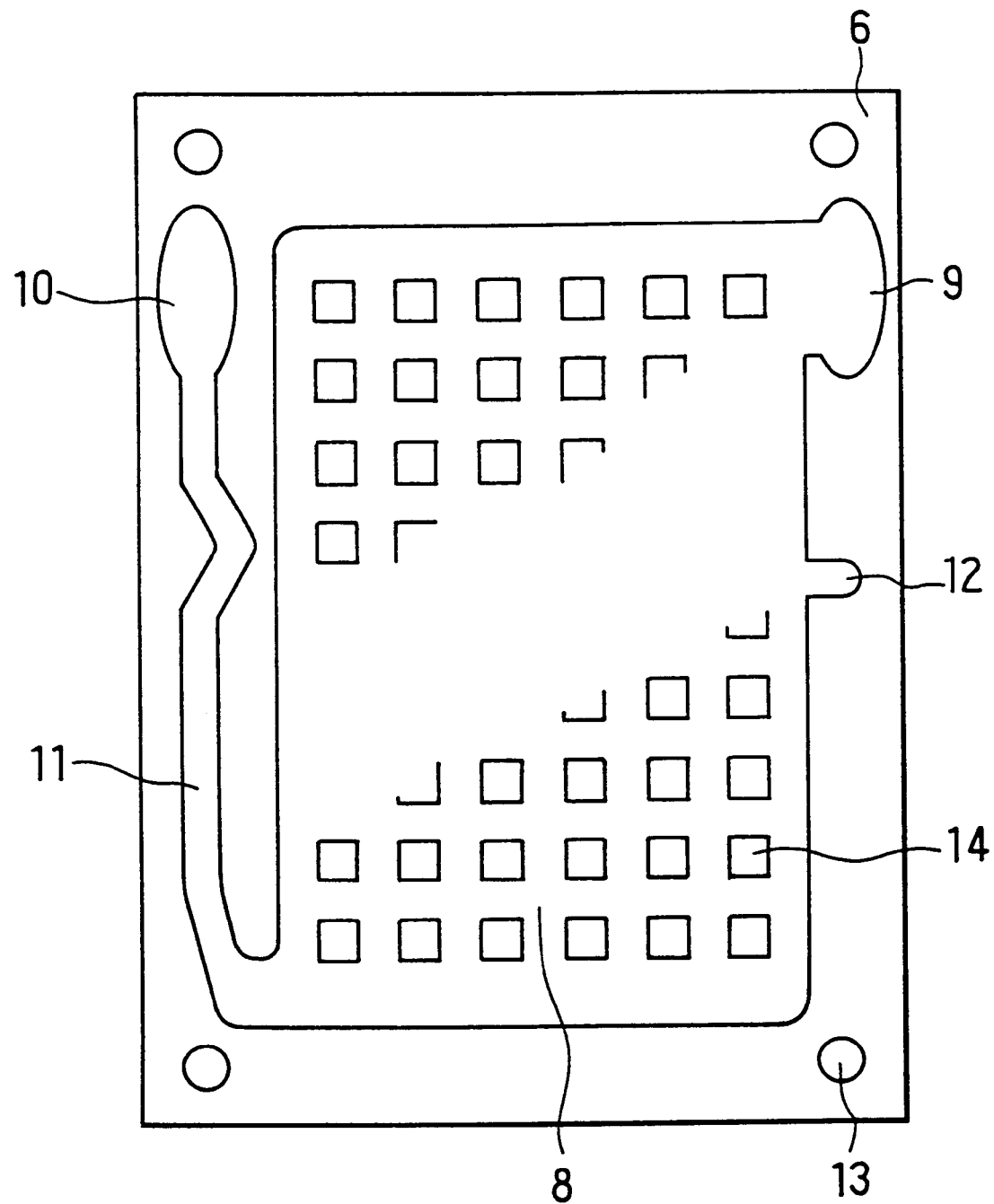
FIG. 2 is a plan view showing a refrigerant case used in the cooling apparatus.

The refrigerant tank 4 is composed of a case 6 and a cover plate 7, both being made of a heat-conductive material such as aluminum. A plan view of the case 6 is shown in FIG. 2. The case 6 is relatively thin and rectangular-shaped and has a front side where spaces including an evaporating space 8 are formed and a flat rear surface on which hot objects to be cooled are attached. Four holes 13 for mounting a substrate 2 carrying a hot object 3 thereon are formed at each corner of the case 6. A pair of header-connecting portions 9, 10, a liquid refrigerant passage 11, an evaporating space 8, a number of square pillars 14 and a filling recess 12 are formed in the case 6. The evaporating space 8 is a space in which the refrigerant evaporates by heat received from the hot objects. A number of square pillars 14 positioned in the evaporating space 8 in a matrix arrangement form refrigerant paths therebetween and also serve to mechanically strengthen the refrigerant tank 4.

A first header tank 16a of the radiator 5 (described later) is inserted into the header-connecting portions 9 that communicates with the evaporating space 8. A second header tank 16b is similarly inserted into the header-connecting portion 10 that also communicates with the evaporating space 8 through the liquid passage 11. The liquid passage 11 connecting the header-connecting portion 10 and a bottom part of the evaporating space 8 is a passage for returning liquid refrigerant condensed in the radiator 5 to the evaporating space 8. The filling recess 12 is a passage for pouring the refrigerant into the refrigerant tank 4. All the portions including the square pillars 14 are integrally formed in the case 6 by machining, electric-discharge, forging, casting or the like.

The cover plate 7 made of, e.g., solder clad aluminum tightly closes the front side of the case 6, thereby forming an enclosed space in the refrigerant tank 4. The first and second header tanks 16a, 16b are inserted into the header-connecting portions 9, 10 of the case 6 through corresponding holes (not shown) formed in the cover plate 7. A filling pipe 15 is also inserted into a hole (not shown) formed in the cover plate 7, so that the refrigerant is supplied to the inner space of the tank 4. An outer opening of the filling pipe 15 is closed after the inner space is filled with the refrigerant.

Figure 1:
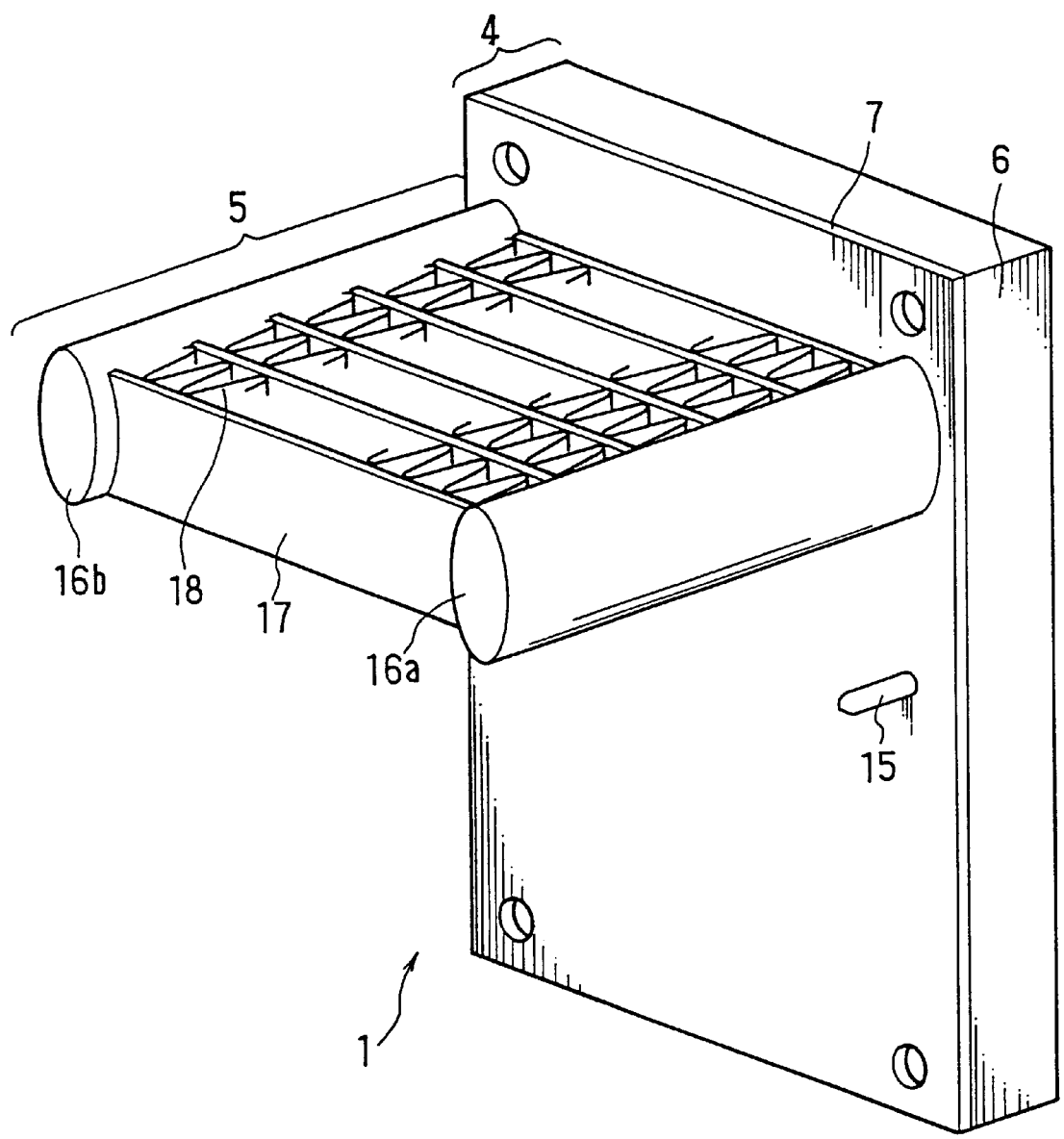
FIG. 1 is a perspective view showing a cooling apparatus of the present invention as a first embodiment.

As shown in FIG. 1, the radiator 5 is composed of a pair of header tanks 16a, 16b, plural tubes 17 connected between the pair of header tanks, and plural fins 18 disposed between neighboring tubes. The radiator 5 is connected and soldered to the refrigerant tank 4 in a direction perpendicular thereto. The tubes 17 connected between both header tanks 16a, 16b are flat tubes in which the refrigerant flows. The fins 18 disposed between the tubes are made of a thin heat conductive metal plate such as an aluminum plate. The fins 18 are corrugated and connected to the tubes so that heat is transferred from the tubes to the fins 18. The heat transferred from the tubes are radiated to air flowing through the fins 18.

Figure 3:
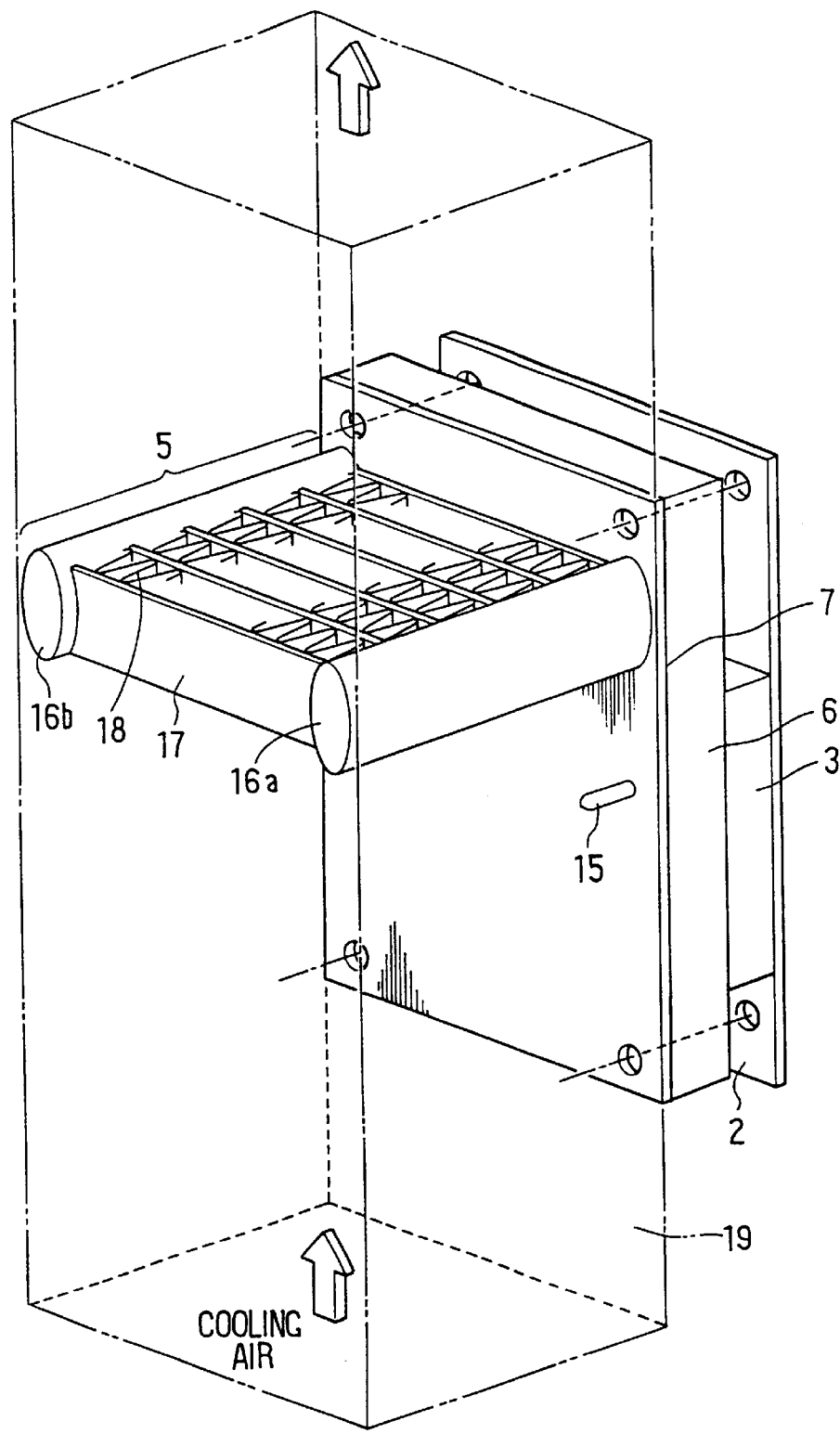
FIG. 3 is a perspective view showing a whole arrangement under which the cooling apparatus of the present invention is used.
Figure 4:
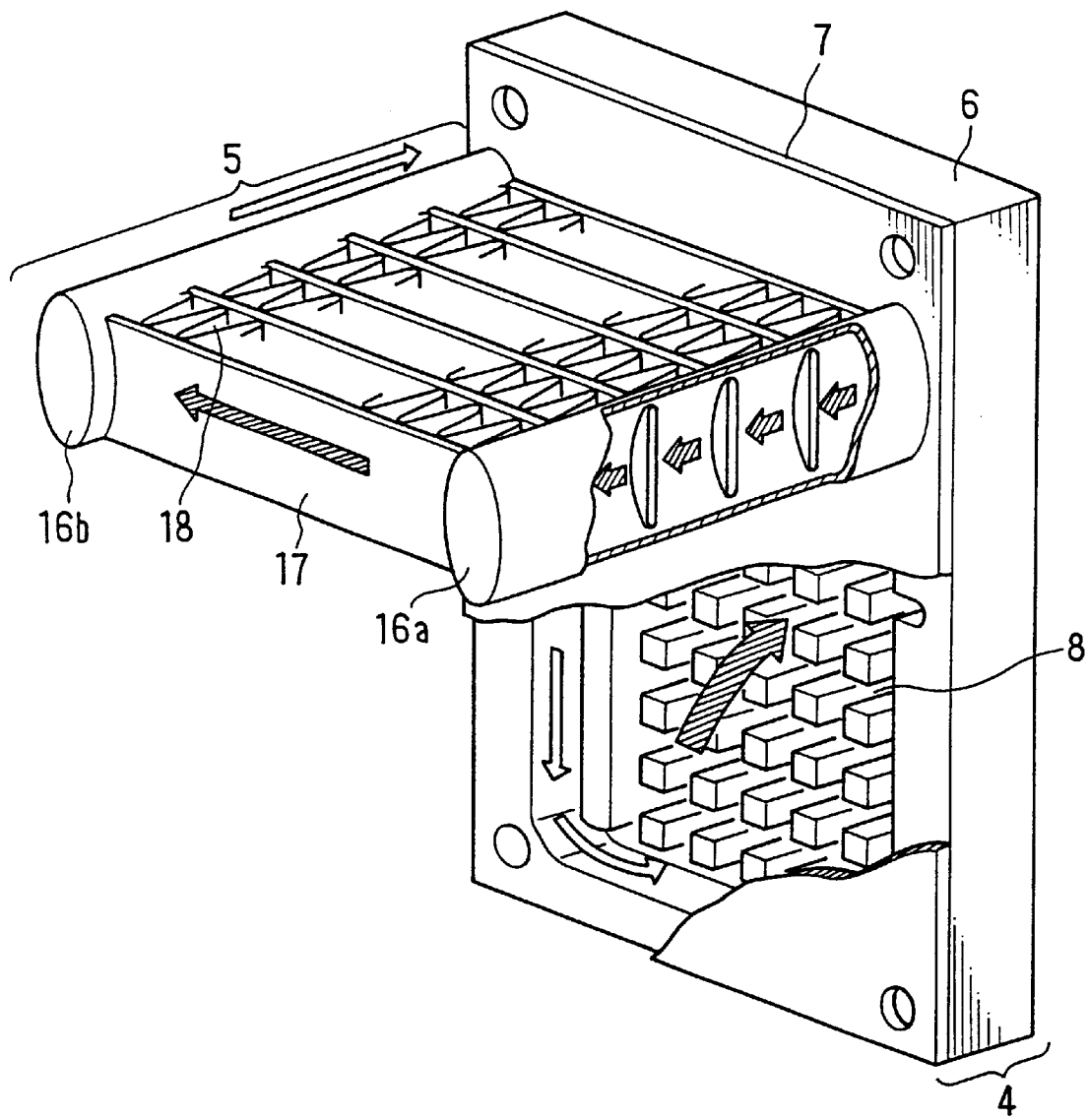
FIG. 4 is a perspective view showing refrigerant paths in the cooling apparatus.

Referring to FIGS. 3 and 4, operation of the cooling apparatus 1 will be described. As shown in FIG. 3, the cooling apparatus 1 is fixed to a duct 19 positioned upright, and the radiator 5 is placed in the duct 19 so that cooling fluid, e.g., cooling air flows through the radiator 5. A hot object to be cooled such as a computer chip 3 mounted on a substrate 2 is attached to the rear surface of the refrigerant tank 4. The rear surface serves as a surface for receiving heat from the hot object. The cooling air flows upward from the bottom of the duct 19, as shown by an arrow in FIG. 3. As shown in FIG. 4, the refrigerant in the tank 4 is evaporated by heat received from the computer chip 3 and flows out from the evaporating space 8 into the first header tank 16a. The vapor refrigerant in the first header tank 16a flows into the second header tank 16b through the plural tubes 17. The vapor refrigerant flowing through the tubes 17 is cooled down by the cooling air passing through the radiator 5 and is condensed into liquid in the tubes 17. The condensed liquid refrigerant sent into the second header tank 16b is supplied again to the evaporating space 8 through the liquid passage 11. The refrigerant circulation described above is repeated, and thereby the computer chip 3 attached to the heat-receiving surface of the refrigerant tank 4 is cooled down.

Figure 5:
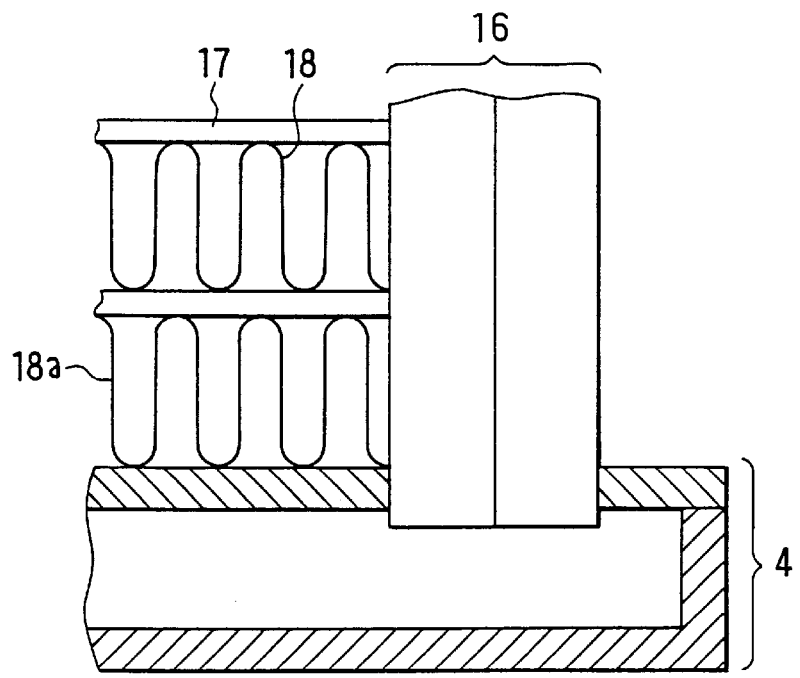
FIG. 5 is a partial cross-sectional view of the cooling apparatus, showing an assembled state of a radiator and a refrigerant tank.

Now, the structure for connecting the radiator 5 to the refrigerant tank 4 will be described. As shown in FIG. 5, both header tanks 16a, 16b of the assembled radiator 5 are inserted into the refrigerant tank 4. In this inserting process, a fin 18a (a bottom fin) contacting the refrigerant tank 4 may be deformed, if the header tanks 16a, 16b are inserted too deep into the tank. On the contrary, if the header tanks 16a, 16b are not inserted deep enough, a space between the bottom fin 18a and the tank 4 will be formed, and thereby the radiator 5 and the tank 4 cannot be properly connected. In order to properly connect the radiator 5 and the tank 4, it is possible to employ various measures. Some of the examples will be described below with reference to FIGS. 6–17.

Figure 6:
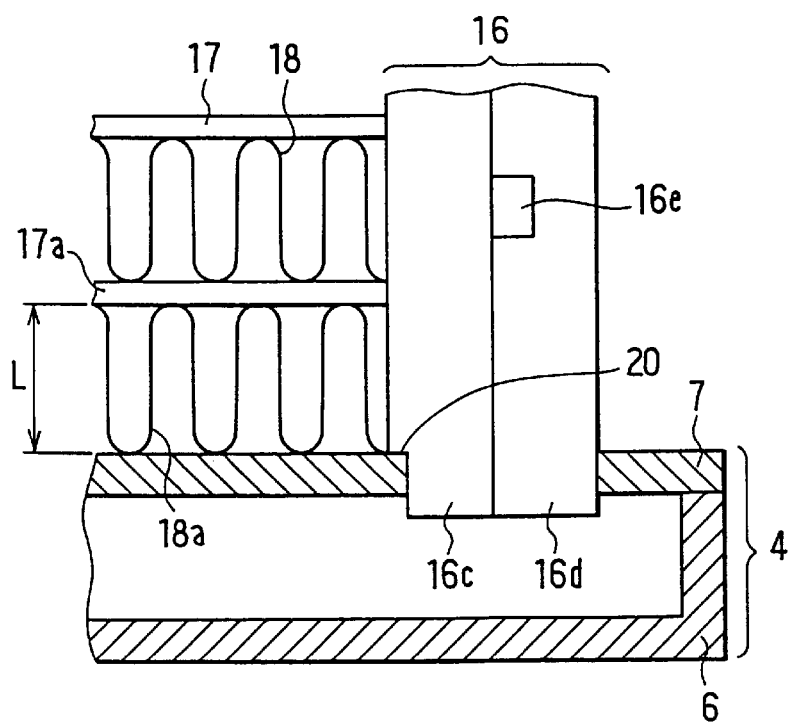
FIG. 6 is a partial cross-sectional view of the cooling apparatus, showing a structure, as example 1, to restrict an insertion length of an header tank into a refrigerant tank.

Example 1 of the structure for restricting an insertion length of the header tanks 16a, 16b into the refrigerant tank 4 is shown in FIG. 6. The bottom fin 18a positioned between a bottom most tubes 17a and the tank 4 has to be kept undeformed when the radiator 5 and the tank 4 are connected. More particularly, the original fin length L has to be kept unchanged, e.g., in a range of ±0.05 mm. Each header tank 16a, 16b is formed by connecting an inner header plate 16c and an outer header plate 16d. Since both header tanks 16a, 16b are identical, one header tank is shown as a header tank 16 representing both header tanks in FIG. 6 and in all the following drawings. In this example 1, a shoulder 20 is formed on the inner header plate 16c, and the inner and outer header plates 16c and 16d are connected to each other. A relative position of both header plates 16c, 16d is kept correctly by a position-setting portion 16e formed on both header plates. The shoulder 20 abuts the upper surface of the cover plate 7, when the header tank 16 is inserted, and thereby the length of insertion is restricted by the shoulder 20. Thus, the radiator 5 and the tank 4 is correctly connected without deforming the bottom fin 18a.

Figure 7:
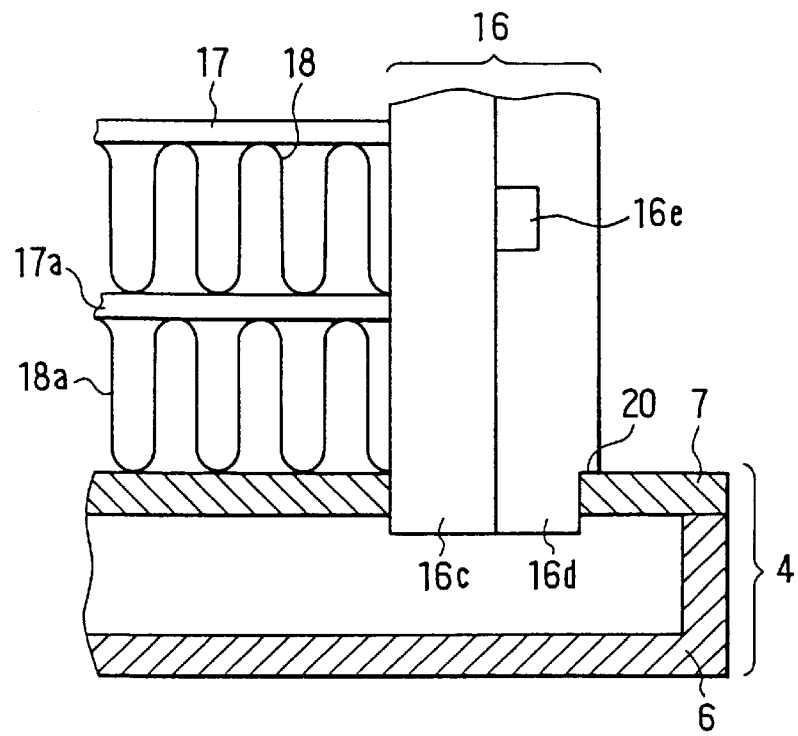
FIG. 7 shows a structure similar to that shown in FIG. 6, as a modified form of example 1.
Figure 8:
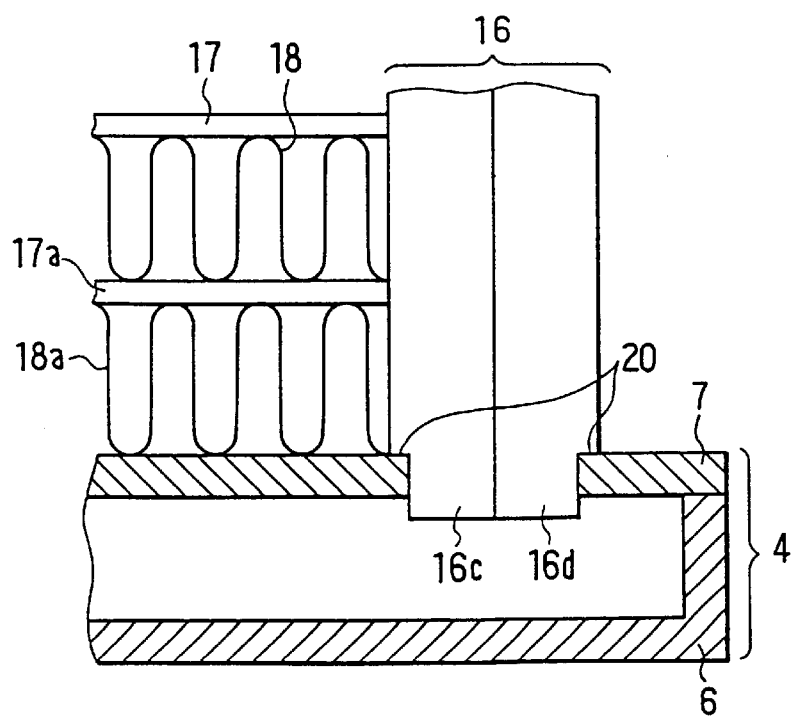
FIG. 8 shows a structure similar to that shown in FIG. 6, as a modified form of example 1.
Figure 9:
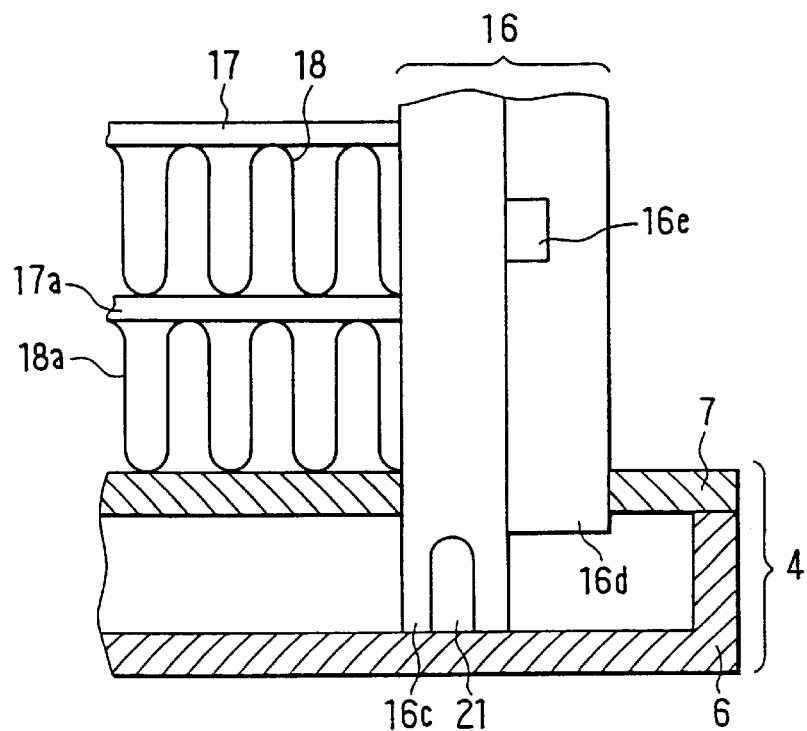
FIG. 9 is a partial cross-sectional view of the cooling apparatus, showing a structure, as example 2, to restrict an insertion length of a header tank into a refrigerant tank.

The structure of example 1 may be modified to a form shown in FIG. 7. The shoulder 20 is formed on the outer header plate 16d in place of the shoulder 20 made on the inner header plate 16c. As shown in FIG. 8, the shoulder 20 may be formed on both header plates 16c and 16d. In this case, the position-setting portion 16e is not necessary. The header tank 16 can be properly inserted into the tank 4 in any one of the manners of example 1 or its modifications, without deforming the bottom fin 18a and without forming a space between the bottom most fin 18a and the cover plate 7.

Figure 10:
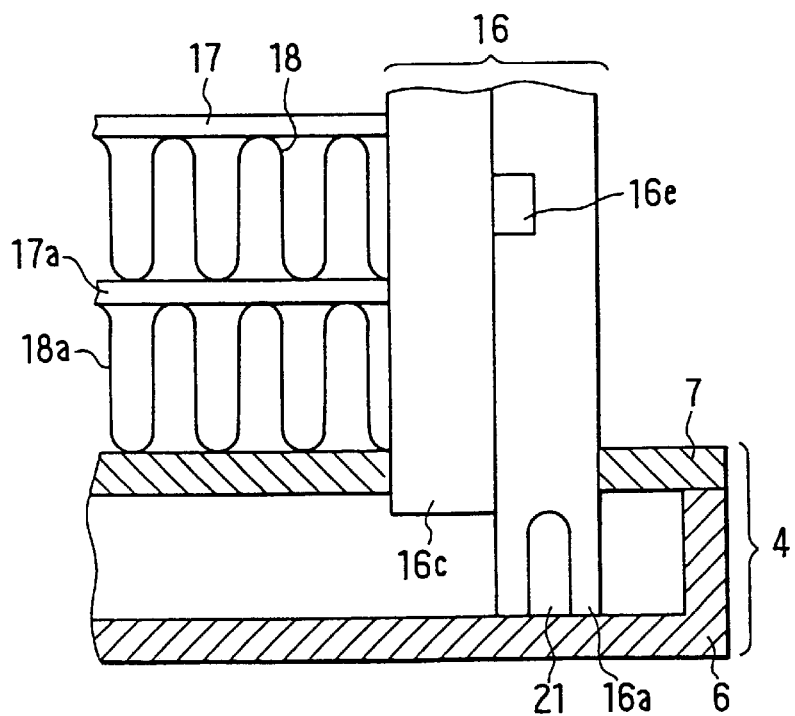
FIG. 10 shows a structure similar to that shown in FIG. 9, as a modified form of example 2.
Figure 11:
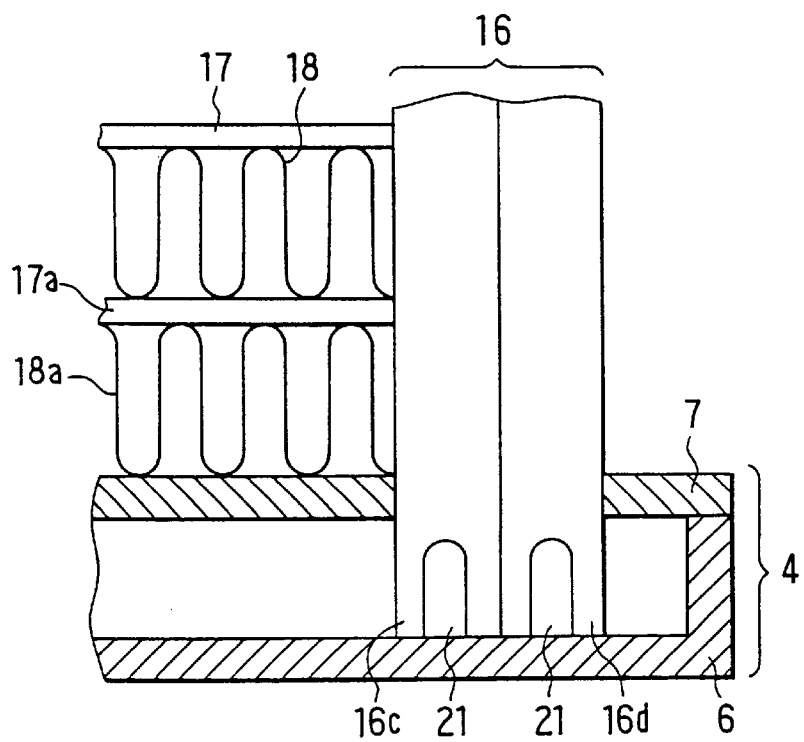
FIG. 11 shows a structure similar to that shown in FIG. 9, as a modified form of example 2.

Another structure for restricting the insertion length is shown in FIG. 2 as example 2. In this example, the inner header plate 16c are extended so that its bottom end abuts the bottom surface of the tank 4, and the outer header plate 16d is connected to the inner header plate 16c at a right position with help of the position-setting portion 16e. An opening 21 is formed at the bottom portion of the inner header plate 16c so that the inner space of the tank 4 freely communicates with the header tank 16. Alternatively, the outer header plate 16d, instead of the inner header tank 16c, may be extended to the bottom of the tank 4 as shown in FIG. 10. In this case, the opening 21 is formed at the bottom portion of the outer header tank 16d. Further, both the inner and outer header plates 16c, 16d may be extended to abut the bottom of the tank 4, as shown in FIG. 11. In this case, the opening 21 for the refrigerant communication is formed on both inner and outer header plates 16c, 16d. No position-setting portion 16e is needed because both header plates 16c, 16d abut the bottom of the tank 4. The header tank 16 can be properly positioned in the tank 4 in any one of the manners of example 2 or its modifications.

Figure 12:
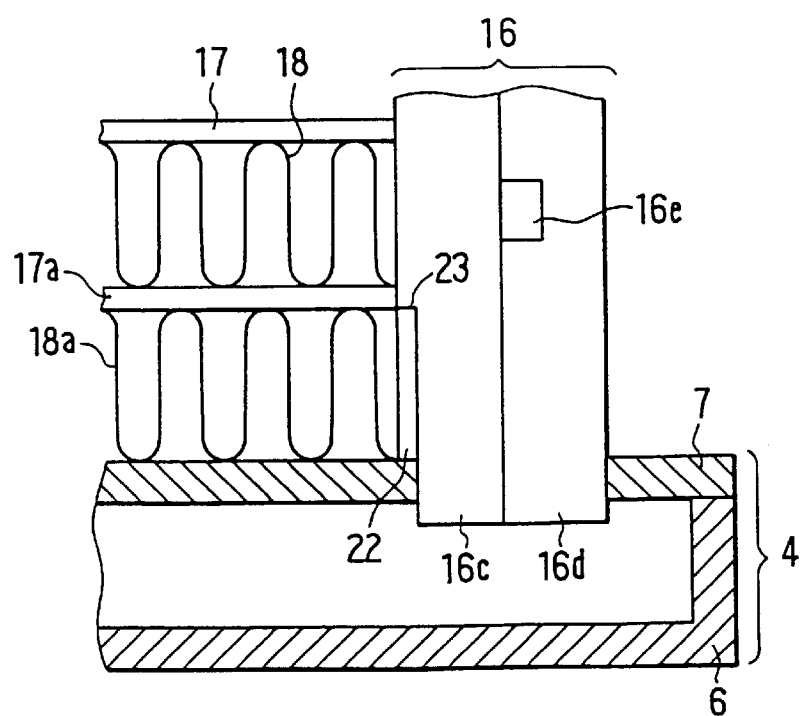
FIG. 12 is a partial cross-sectional view of the cooling apparatus, showing a structure, as example 3, to restrict an insertion length of a header tank into a refrigerant tank.
Figure 13:
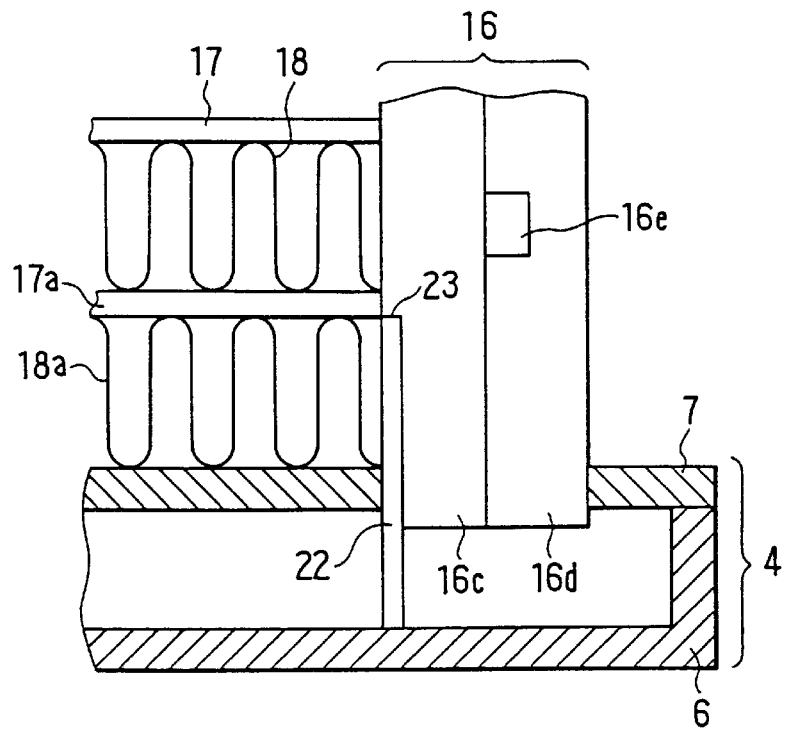
FIG. 13 shows a structure similar to that shown in FIG. 12, as a modified form of example 3.
Figure 14:
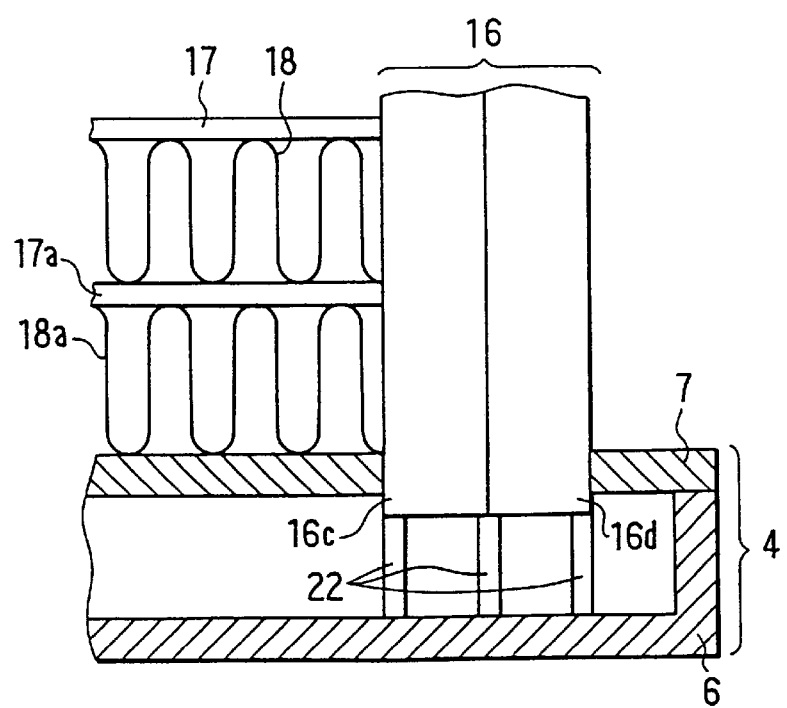
FIG. 14 shows a structure similar to that shown in FIG. 12, as a modified form of example 3.

Example 3 for the restricting insertion length is shown in FIG. 12. In this example, a spacer 22 is interposed between a shoulder 23 formed on the inner header plate 16c and the cover plate 7. The outer header plate 16d is connected to the inner header plate 16c at a right position via the position-setting portion 16e. The insertion length is restricted by the spacer 22, and therefore the radiator 5 is correctly assembled to the tank 4. Alternatively, the spacer 22 may be placed between the shoulder 23 and the bottom surface of the tank 4, as shown in FIG. 13. Though the spacer 22 is placed to support the inner header plate 16c both in the structures shown in FIGS. 12 and 13, the spacer 22 may be placed to support the outer header plate 16d. Further, plural spacers 22 may be used to support both the inner and outer header plates 16c, 16d, a s shown in FIG. 14. In the structure of FIG. 14, no position-setting portion 16e is required. The insertion length of the header tubes is properly restricted by either one of the forms of example 3.

Figure 15:
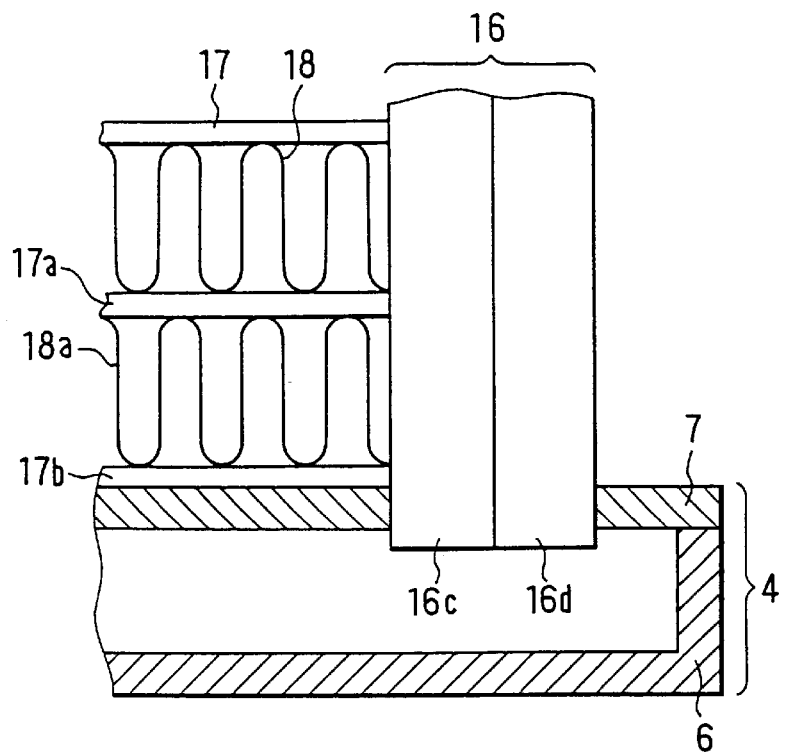
FIG. 15 is a partial cross-sectional view of a cooling apparatus, showing a structure, as example 4, to restrict an insertion length of a header tank into a refrigerant tank.

Example 4 is shown in FIG. 15. In this example, an additional tube 17b is placed between the bottom fin 18a and the cover plate 7, so that the insertion length of the header tank 16 is restricted by the additional tube 17b. Since the additional tube 17b is firmly connected to both header tanks 16a, 16b, the radiator 5 is properly assembled to the tank 4 without deforming the bottom fin 18a. It is also possible to place a certain spacer in place of the additional tube 17b.

Figure 16:
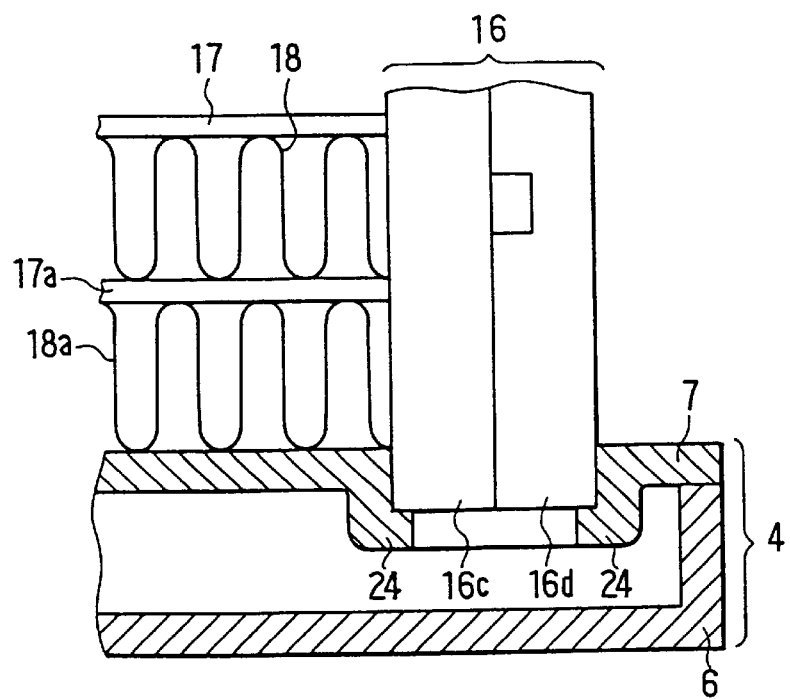
FIG. 16 is a partial cross-sectional view of a cooling apparatus, showing a structure, as example 5, to restrict an insertion length of a header tank into a refrigerant tank.

Example 5 is shown in FIG. 16. In this example, a recess 24 for receiving the header tank 16 is formed on the cover plate 7, so that the insertion length of the header tank 16 is restricted by the recess 24. In this structure, mechanical strength of the cooling apparatus 1 is enhanced because the bottom end of the header tank 16 can be soldered to the recess 24.

Figure 17:
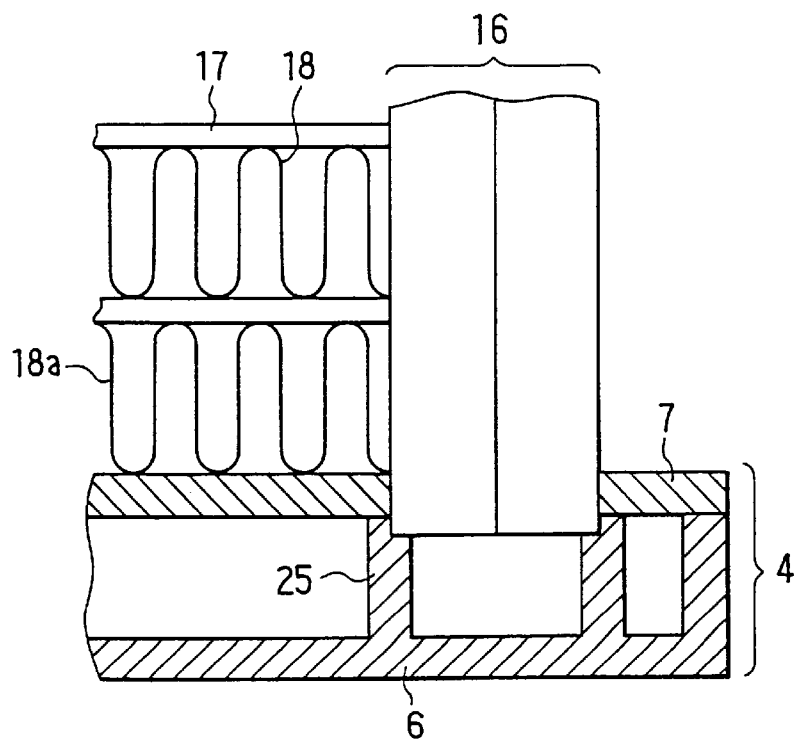
FIG. 17 is a partial cross-sectional view of a cooling apparatus, showing a structure, as example 6, to restrict an insertion length of a header tank into a refrigerant tank.
Figure 18:
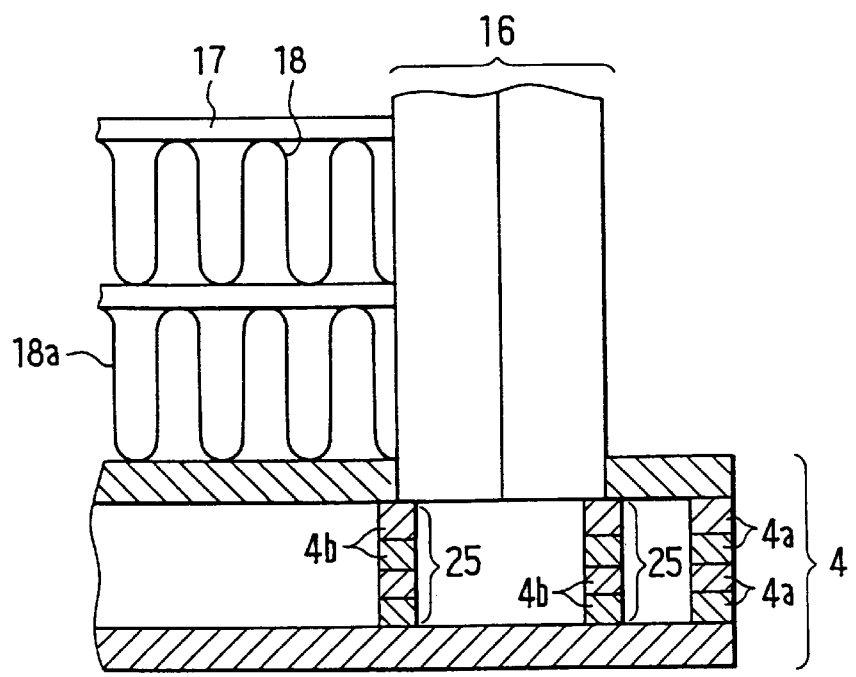
FIG. 18 shows a structure similar to that shown in FIG. 17, as a modified form of example 6.

Example 6 is shown in FIG. 17, in which spacers 25 are formed integrally with the refrigerant case 6. The spacers 25 support the header tank 16 to restrict its insertion length into the tank 4. The spacers 25 of FIG. 17 may be modified into a form shown in FIG. 18. When the refrigerant tank 4 is formed by laminating several plates 4a, a part 4b of the spacers 25 can be easily formed on the respective plates 4a. By laminating the parts 4b of the several plates 4a, the spacers 25 can be formed. The bottom end of the header tank 16 may be soldered to the upper surface of the spacers 25 to enhance the mechanical strength. In this case, a certain amount of solder is placed between the bottom end of the header tank 16 and the upper surface of the spacers 25, and the height of the spacers 25 is designed so that the insertion length becomes proper when the solder melts and the header tank 16 directly contacts the spacers 25.

(Second Embodiment)

Figure 19:
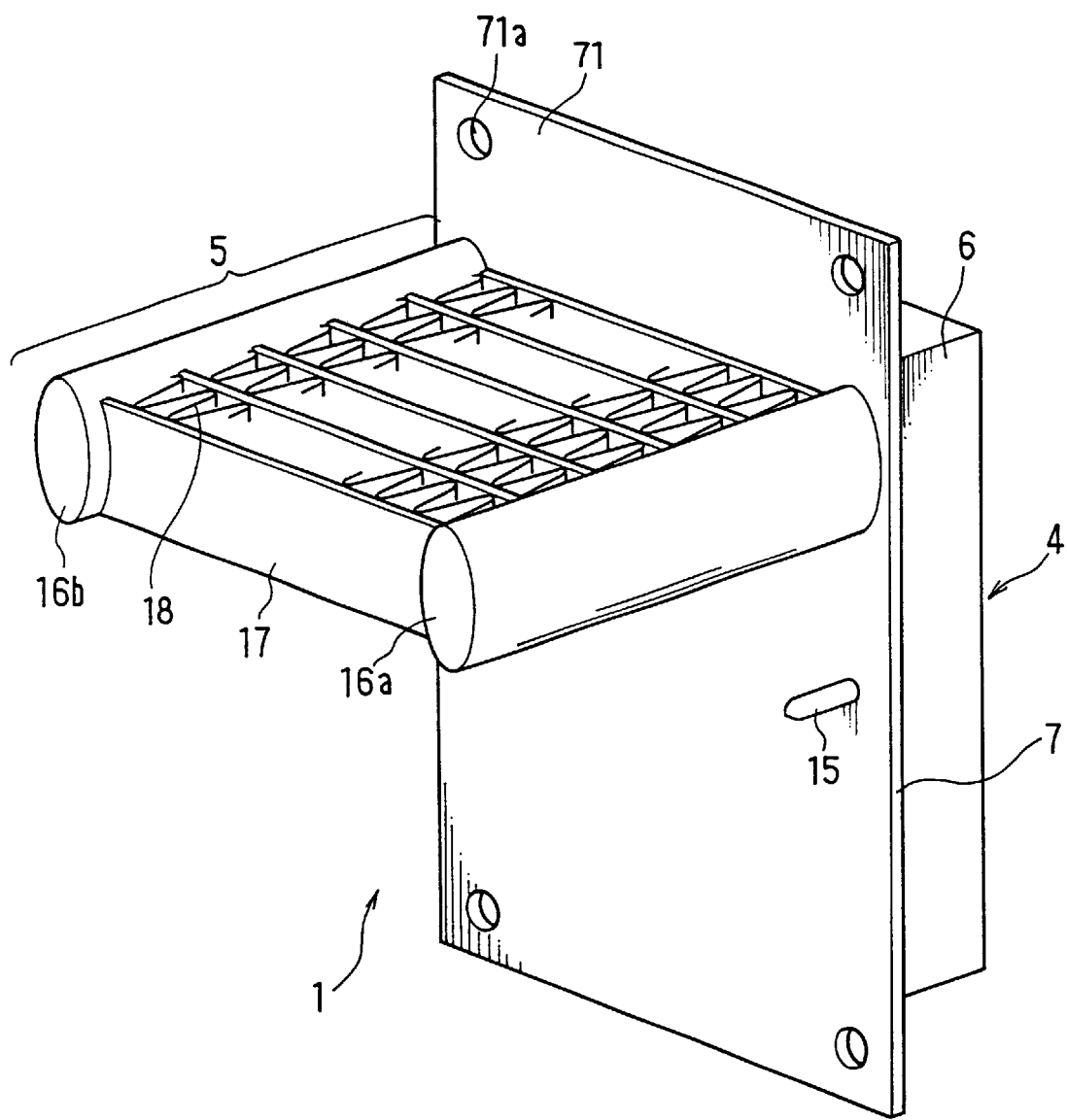
FIG. 19 is a perspective view showing a cooling apparatus of the present invention as a second embodiment.
Figure 22:
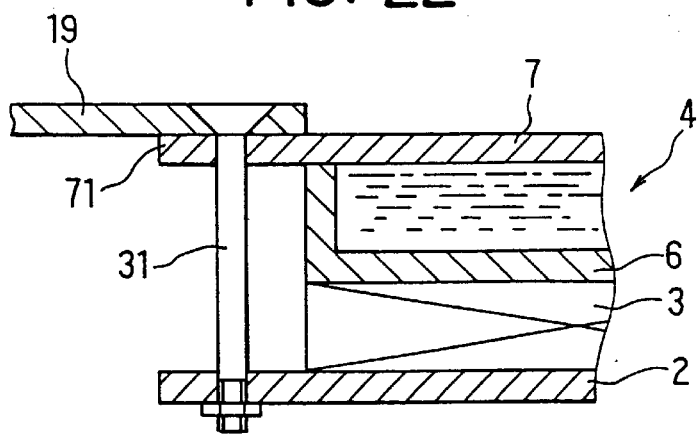
FIG. 22 is a partial cross-sectional view showing a state where a hot object to be cooled is mounted on the second embodiment.
Figure 23:
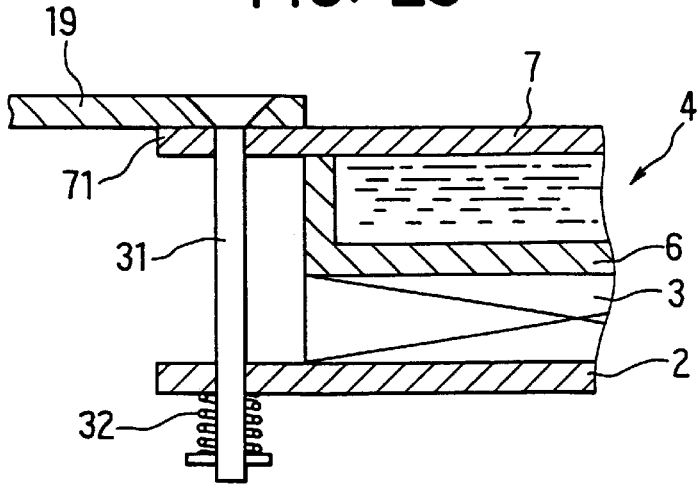
FIG. 23 shows a mounting structure modified from that shown in FIG. 22.
Figure 24:
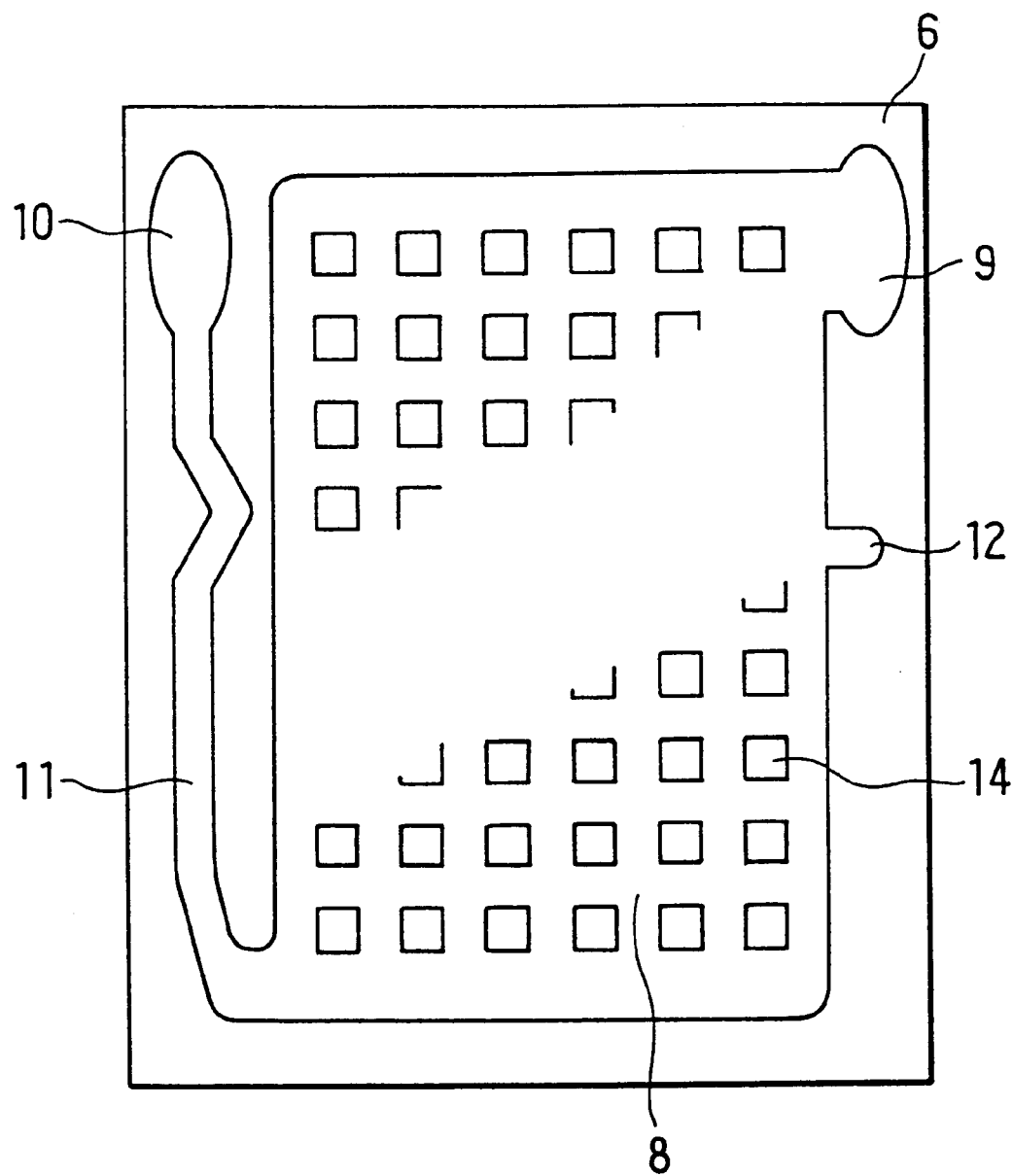
FIG. 24 is a plan view showing a refrigerant case used in the second embodiment.

Referring to FIGS. 19–27, a second embodiment of the present invention will be described. In this embodiment, the cover plate 7 is enlarged, compared with that of the first embodiment shown in FIG. 1, to extend both from the upper and bottom edges of the refrigerant case 6, as shown in FIG. 19. The extended portions of the cover plate 7 constitute mounting stays 71 where holes 71a for mounting the substrate 2 carrying the computer chip 3 thereon are formed. The refrigerant case 6 of the second embodiment is shown in FIG. 24. Because the mounting holes are formed on the cover plate 7, there is no need to form the mounting holes in the refrigerant case 6. In this manner, the inside space of the refrigerant tank 4 is fully utilized.

Figure 20:
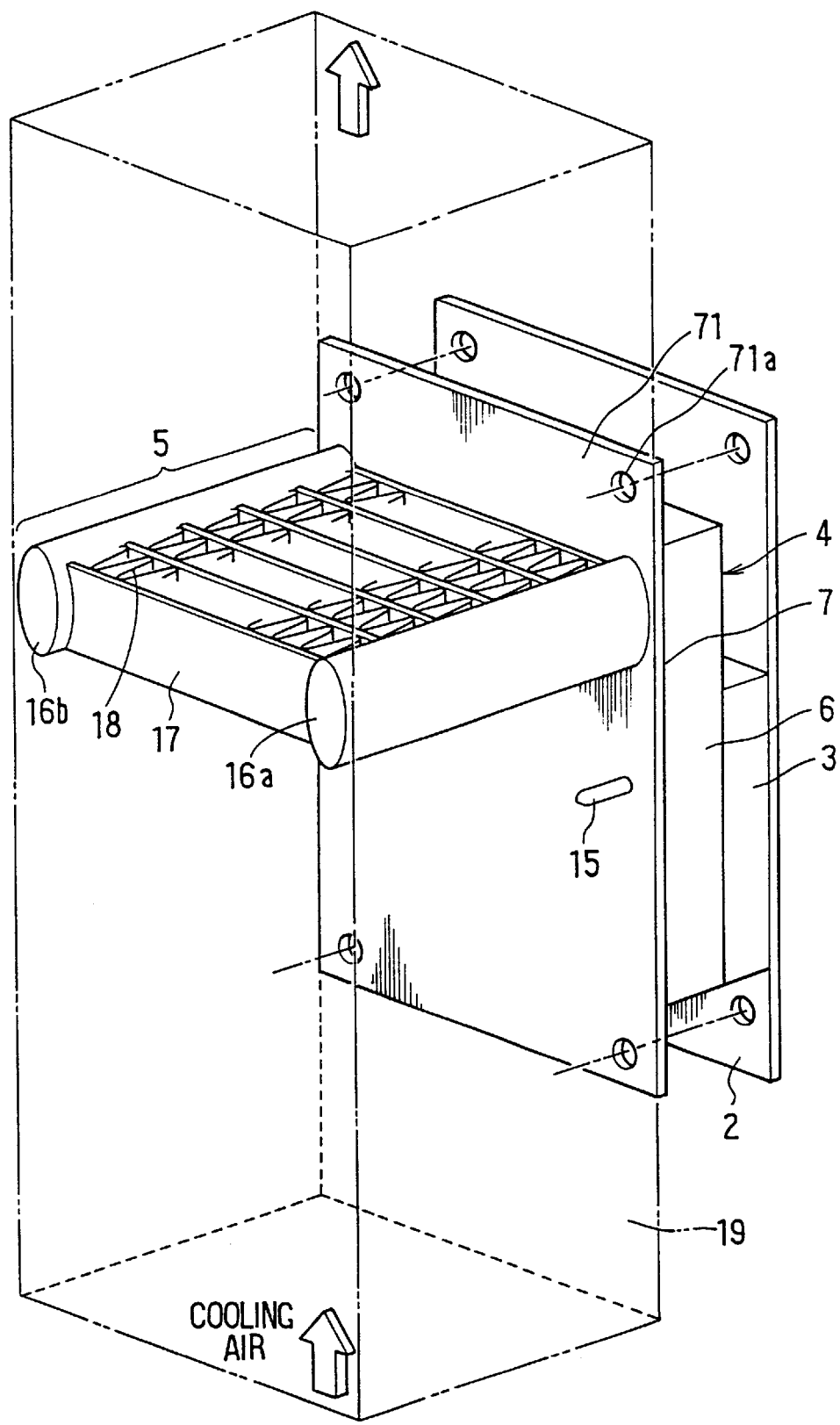
FIG. 20 is a perspective view showing a whole arrangement under which the cooling apparatus as the second embodiment is used.
Figure 21:
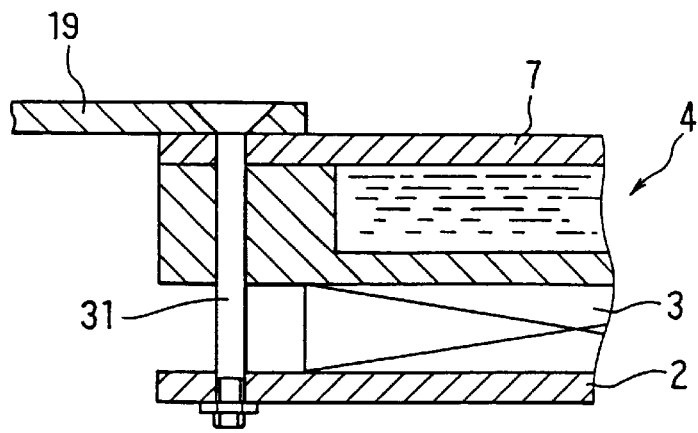
FIG. 21 is a partial cross-sectional view showing a state where a hot object to be cooled is mounted on the first embodiment.

As shown in FIG. 20, the tank 4 is mounted on the duct 19 that stands upright in the same manner as in the first embodiment. The substrate 2 carrying the computer chip 3 thereon is fixed to the cover plate 7, so that the computer chip 3 to be cooled contacts the heat-receiving surface of the tank 4. As shown in FIG. 22, the tank 4 and the substrate 2 are fixed to the duct 19 with common bolts 31 at four corners of the cover plate 7. FIG. 21 shows the mounting structure of the first embodiment, where the mounting holes are formed through the body of the refrigerant case. Comparing the mounting structure shown in FIG. 22 with that shown in FIG. 21, it will be apparent that the inside space of the tank 4 is more fully utilized in the structure shown in FIG. 22.

Since the mounting stays 71 extend outwardly beyond the upper and bottom edges of the refrigerant case 6, they have certain resiliency. Therefore, the computer chip 3 closely contacts the heat-receiving surface of the tank 4, when the substrate 2 is fixed to the stays 71 by bolts 31. To further increase the mounting resiliency, a resilient member 32 such as a spring or a rubber bushing may be used in the manner as shown in FIG. 23. By the mounting resiliency, good contact between the computer chip 3 and the heat-receiving surface is maintained if the computer chip 3 expands or shrinks due to heat cycles. The structures of the second embodiment other than the mounting structure described above are the same as those of the first embodiment, and the second embodiment operates in the same manner as the first embodiment.

Figure 25:
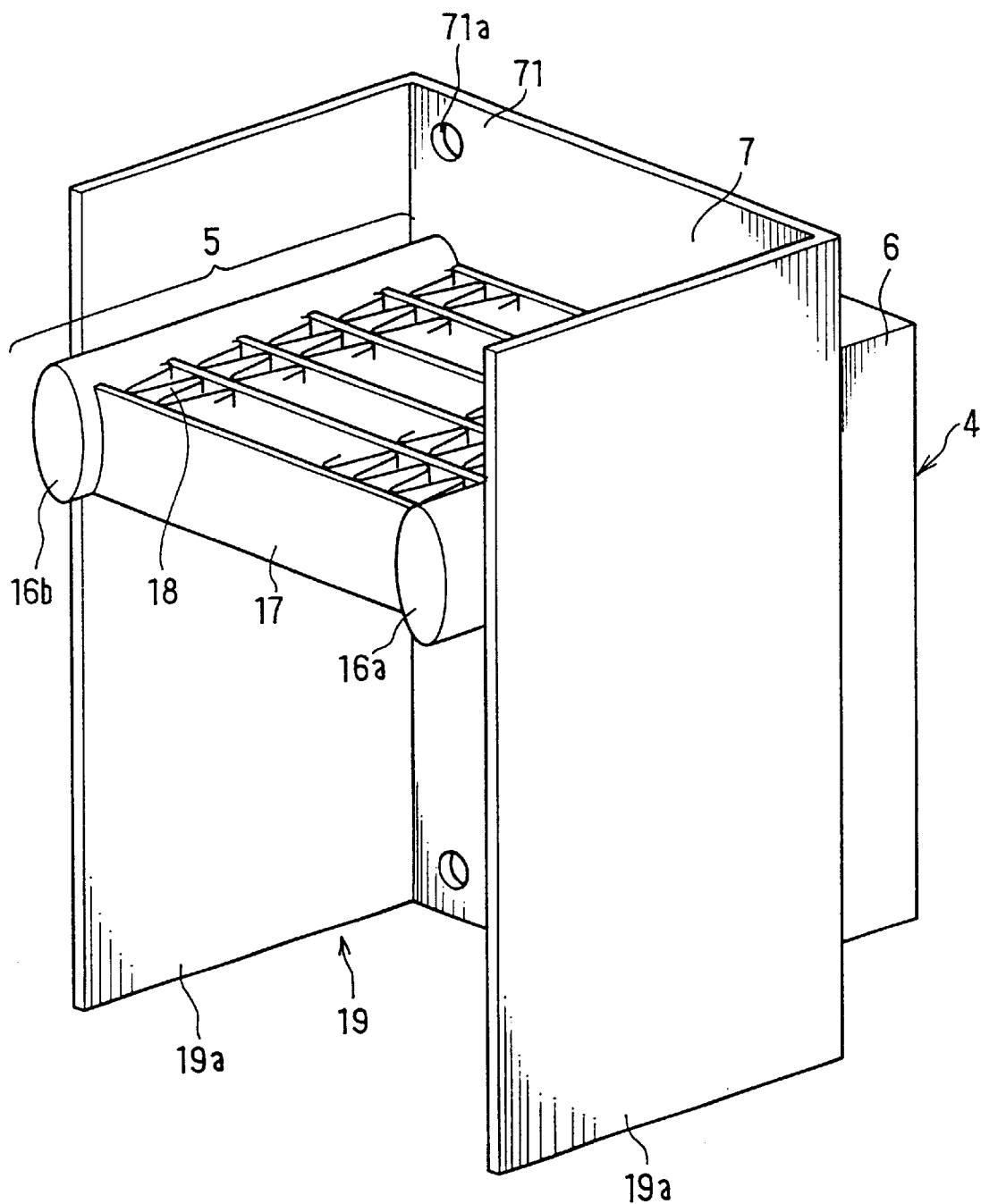
FIG. 25 is a perspective view showing modification 1 of the second embodiment shown in FIG. 19.
Figure 26:
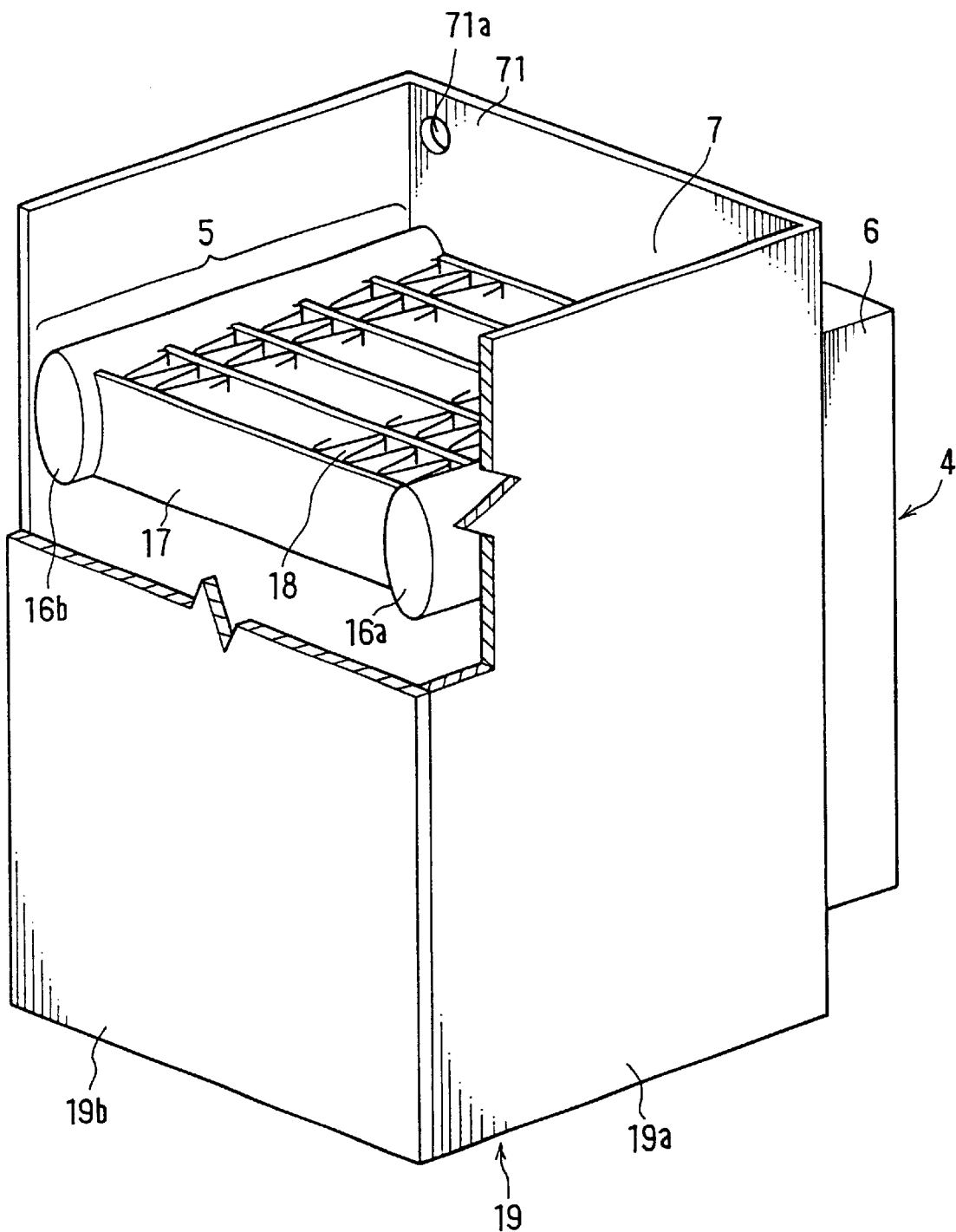
FIG. 26 is a perspective view showing modification 2 of the second embodiment shown in FIG. 19.
Figure 27:
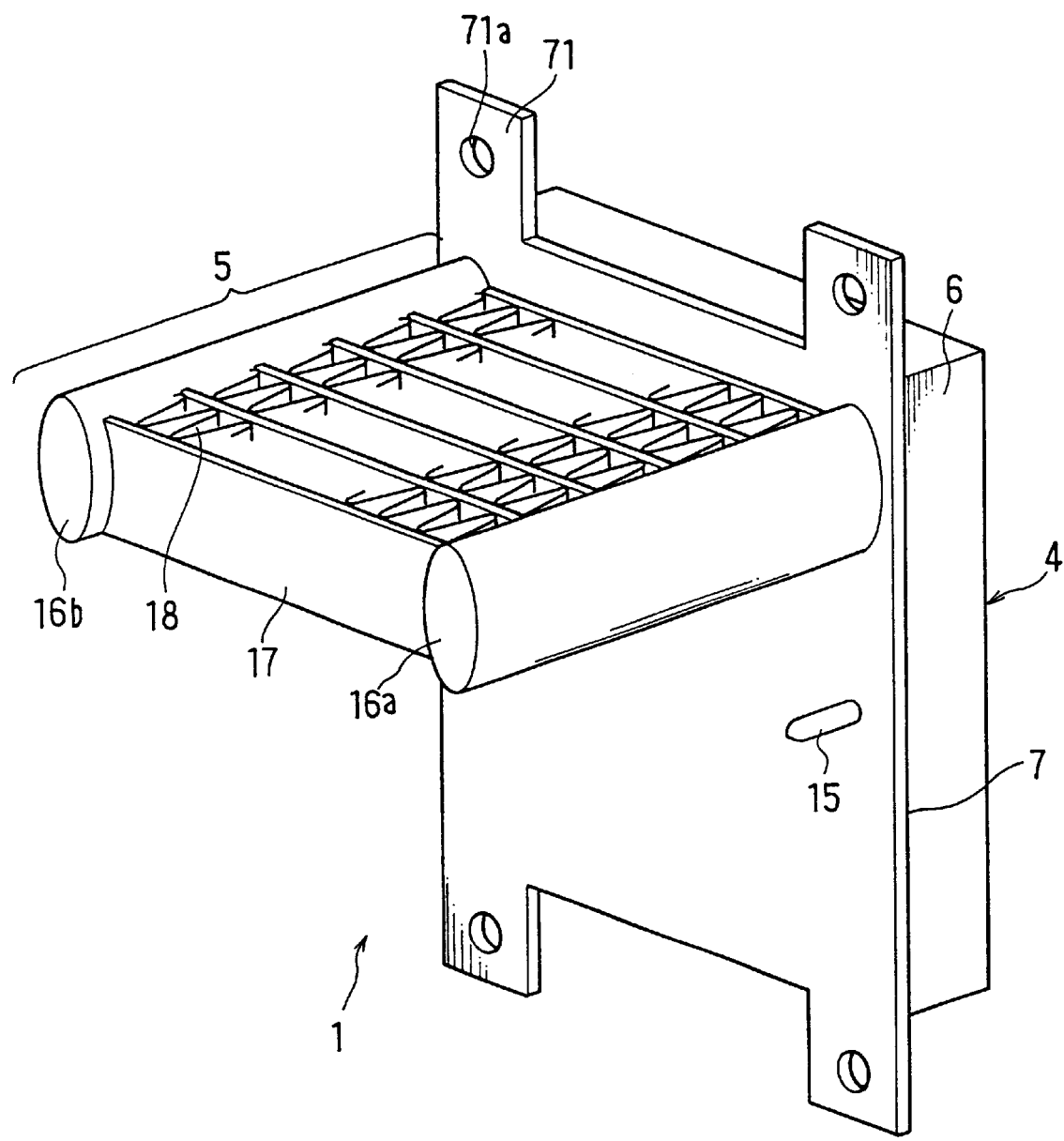
FIG. 27 is a perspective view showing modification 3 of the second embodiment shown in FIG. 19.

The duct 19 attached to the cooling apparatus 1 may be modified to the form shown in FIG. 25. In this modification, side walls 19a of the duct 19 are formed integrally with the cover plate 7, and a front wall of the duct is eliminated. The cooling air flows through the duct 19 more smoothly because there is no member for connecting the cover plate 7 and the duct 19. As shown in FIG. 26, a front wall 19b may be added to the duct 19. Further, the cover plate 7 of the second embodiment may be modified in the form shown in FIG. 27, if the cover plate 7 is not integrally formed with the duct 19. In this modification, only the stays 71a are extended beyond the upper and lower edges of the refrigerant case 6.

(Third Embodiment)

Figure 33A:
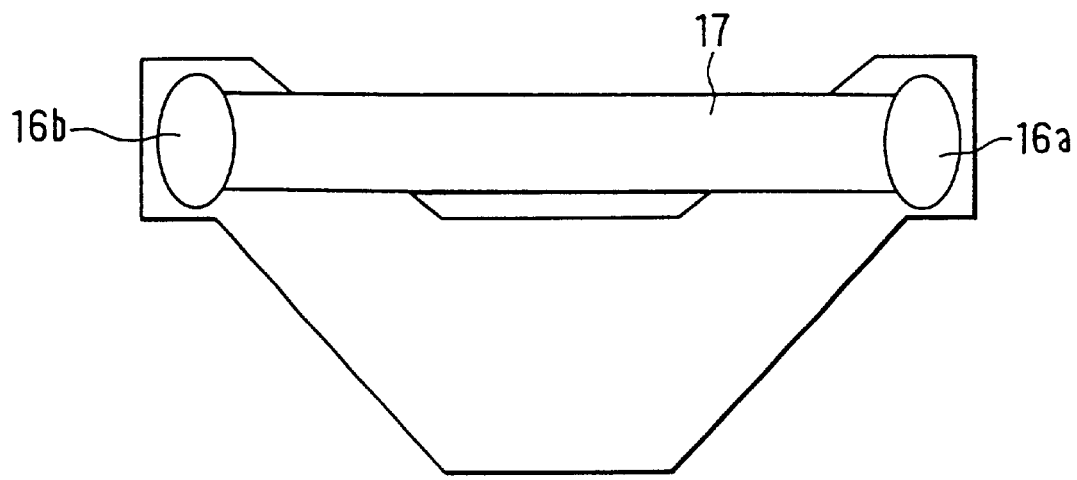
FIG. 33A is a front view showing modification 3 of the third embodiment.
Figure 33B:
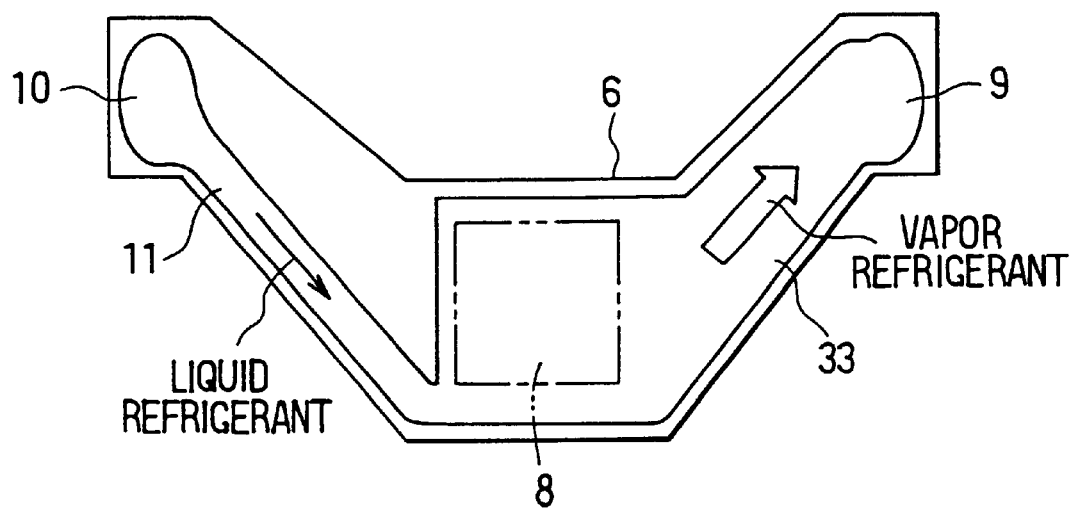
FIG. 33B is a plan view showing refrigerant paths in a refrigerant tank of modification 3 of the third embodiment.
Figure 34A:
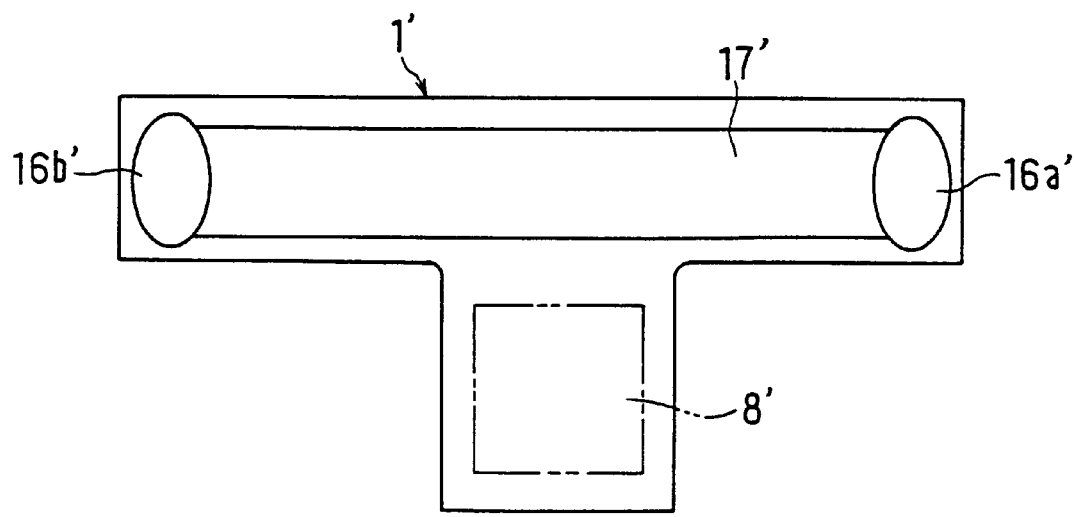
FIG. 34A is a front view showing a cooling apparatus in which refrigerant enters into a refrigerant tank in a same direction as it flows out.
Figure 34B:
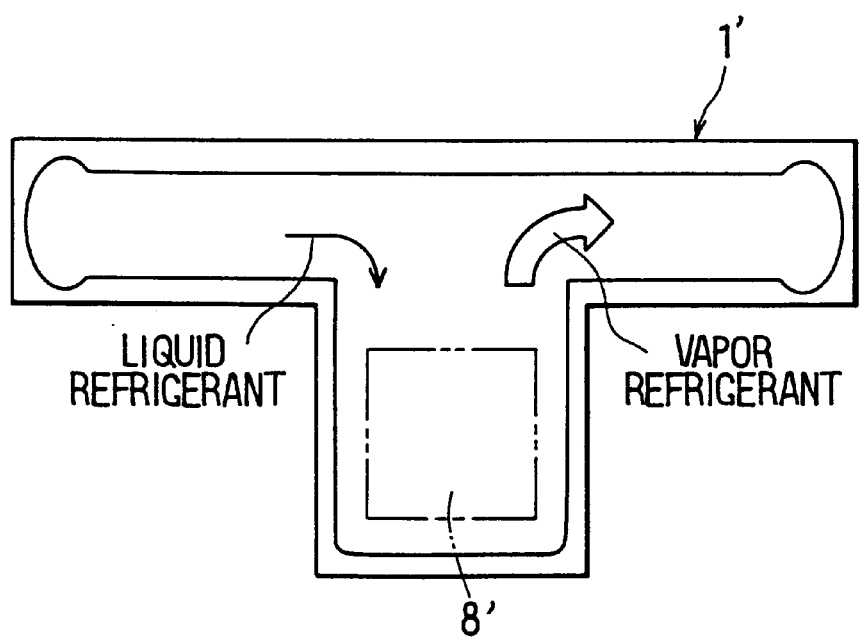
FIG. 34B is a plan view showing refrigerant paths inside a refrigerant tank shown in FIG. 34A.

A third embodiment of the present invention will be described with reference to FIGS. 28–34B. If the size of the computer chip 3 to be cooled is small relative to the size of the substrate 2, and other components mounted on the substrate 2 stand high thereon, such components may interfere with the rear surface of the refrigerant tank 4. In this case, it is necessary to reduce the size of the heat-receiving surface to match the computer chip size. An example in which the heat-receiving surface size is reduced is shown in FIG. 34A. If the heat-receiving size is simply reduced in this manner, the liquid refrigerant flow interferes with the vapor refrigerant flow as shown in FIG. 34B, because their flow directions are the same. Such interference is detrimental to cooling efficiency.

FIG. 34A is a front view of this undesirable example. The structure of the cooling apparatus 1' is substantially the same as that of the first embodiment. A first header tank 16a' through which the vapor refrigerant comes out from the tank, a second header tank 16b' through which the liquid refrigerant flows into the tank, and tubes 17' connecting both header tanks are similarly provided. An evaporating space 8' is provided in a refrigerant case having a reduced size. An hot object is attached to the rear side of the evaporating space 8'. In this arrangement, the flow directions of the incoming liquid refrigerant and the outgoing vapor refrigerant are the same as shown in FIG. 34B. Therefore, the liquid refrigerant interferes with the vapor refrigerant, thereby reducing the cooling efficiency. In the third embodiment of the present invention, the size of the heat-receiving surface is reduced without sacrificing the cooling efficiency.

Figure 28:
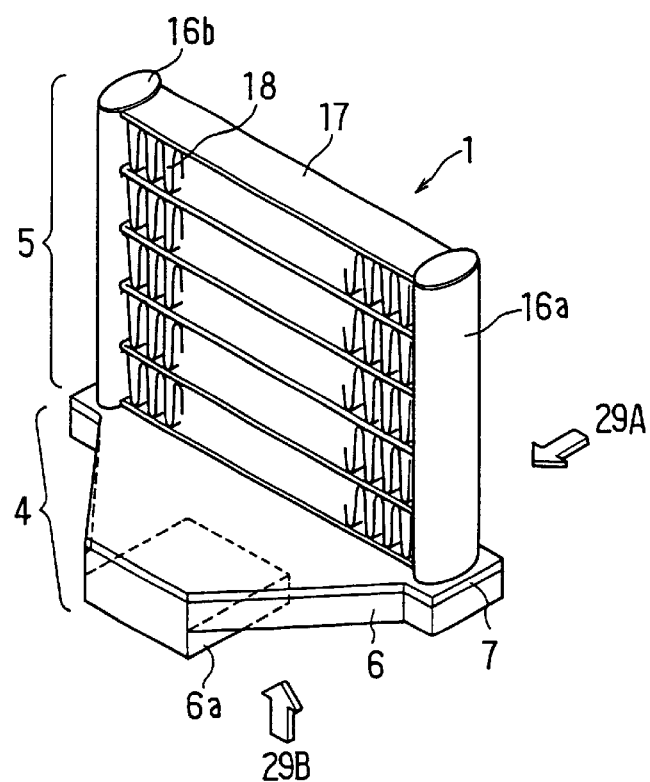
FIG. 28 is a perspective view showing a cooling apparatus of the present invention as a third embodiment.
Figure 29A:
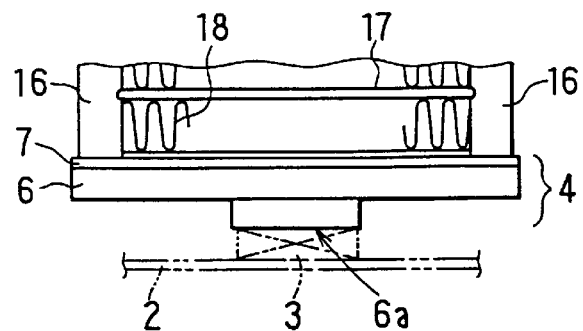
FIG. 29A is a side view showing a state where a computer chip to be cooled is attached to a heat-receiving surface of the cooling apparatus of the third embodiment, viewed from a direction of arrow 29A in FIG. 28.
Figure 29B:
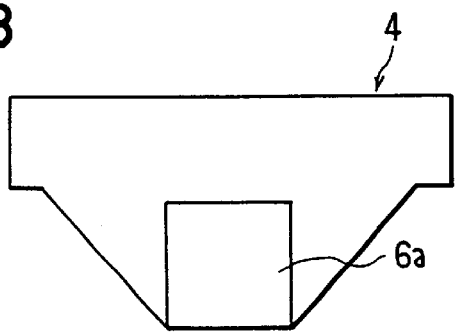
FIG. 29B is a plan view showing the same state as in FIG. 29A, viewed from a direction of arrow 29B in FIG. 28.

As shown in FIG. 28, the refrigerant tank 4 of the third embodiment is formed in a substantially trapezoidal shape. The heat-receiving surface 6a is elevated from the rear surface of the tank 4. A small hot object such as a computer chip 3 is attached to the elevated heat-receiving surface. FIG. 29A shows the cooling apparatus 1 to which the computer chip 3 mounted on the substrate 2 is attached, viewed from the direction of arrow 29A in FIG. 28. The computer chip 3 to be cooled is attached to the heat-receiving surface 6a which is elevated from the rear surface of the tank 4. Therefore, a larger space is provided between the rear surface of the tank 4 and the substrate 2. FIG. 29B shows the rear surface, viewed from the direction of arrow 29B in FIG. 28, of the tank 4 on which the elevated heat-receiving surface 6a is provided.

Figure 30A:
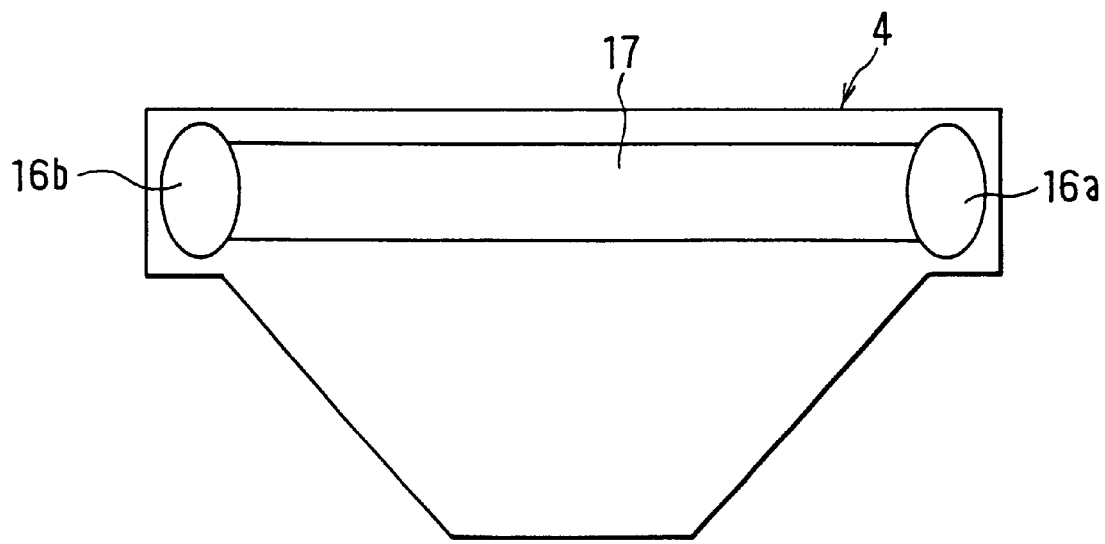
FIG. 30A is a front view showing the third embodiment.
Figure 30B:
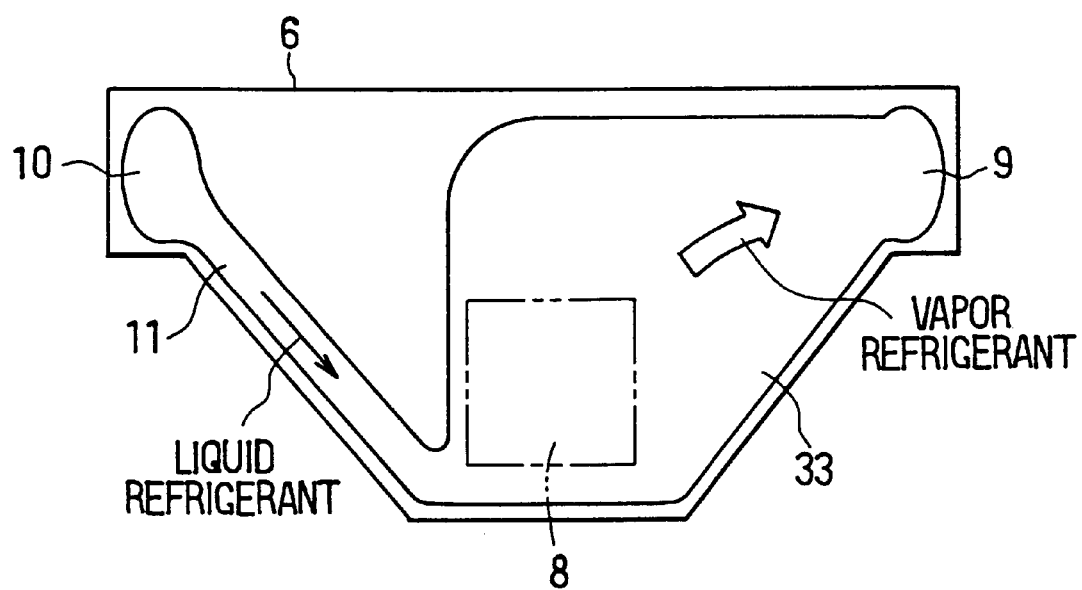
FIG. 30B is a plan view showing refrigerant paths in a refrigerant tank of the third embodiment.

FIG. 30A shows the front view of the cooling apparatus 1, and FIG. 30B shows the liquid passage 11, the vapor passage 33 and the evaporating space 8 in the refrigerant case 6. As shown in FIG. 30B, the liquid refrigerant enters into the evaporating space 8 from the header-connecting portion 10 through the liquid passage 11. The vapor refrigerant evaporated in the evaporating space 8 flows out from the header-connecting portion 9 through the vapor passage 33. Since the liquid passage 11 and the vapor passage 33 are separated and both paths are not in the same direction, as opposed to the example shown in FIG. 34B, the liquid refrigerant does not interfere with the vapor refrigerant.

Figure 31A:
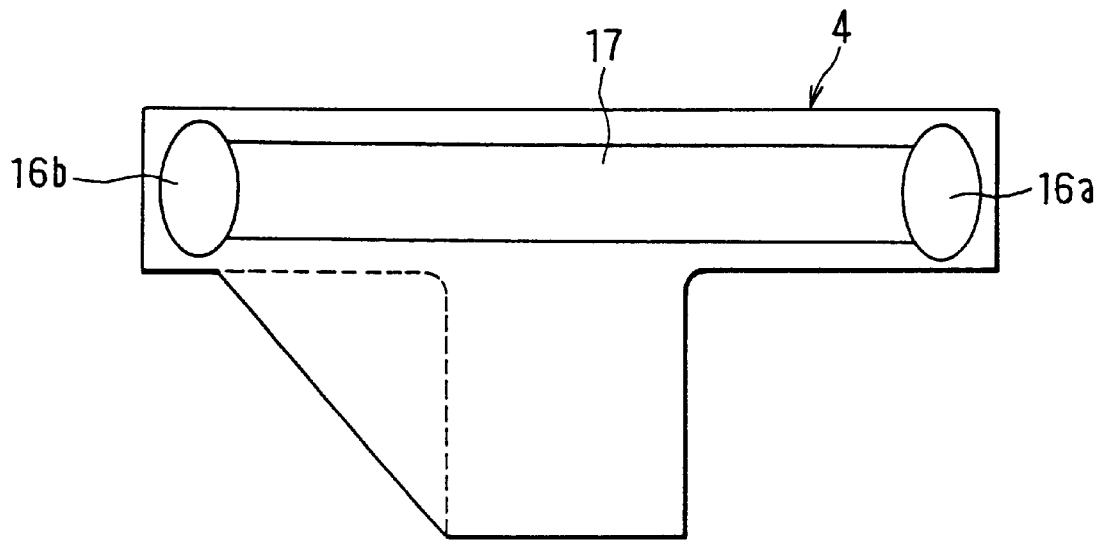
FIG. 31A is a front view showing modification 1 of the third embodiment.
Figure 31B:
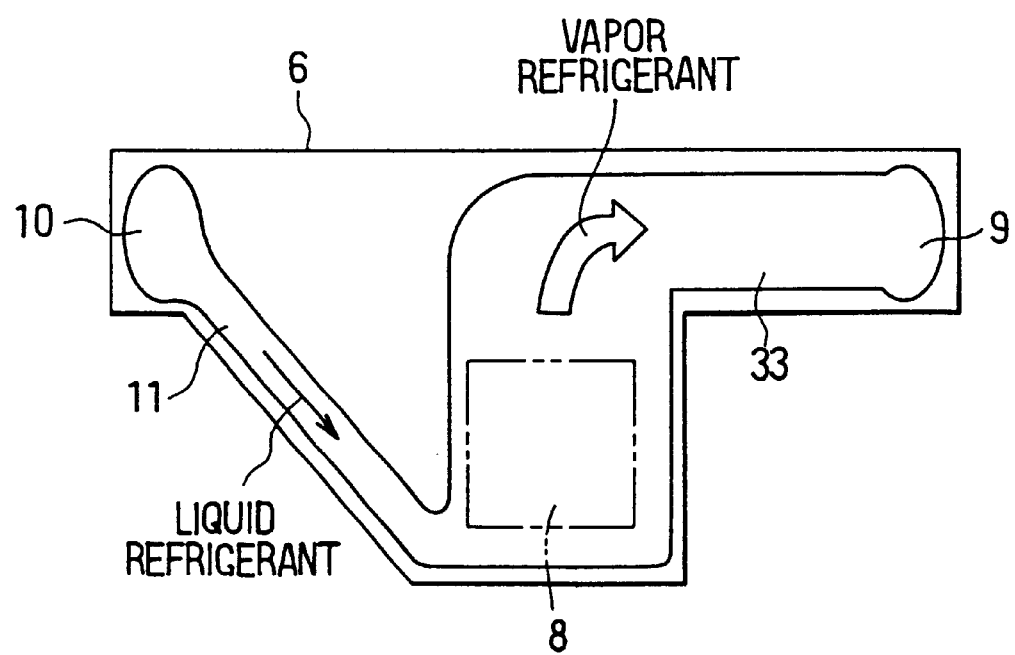
FIG. 31B is a plan view showing refrigerant paths in a refrigerant tank of modification 1 of the third embodiment.
Figure 32A:
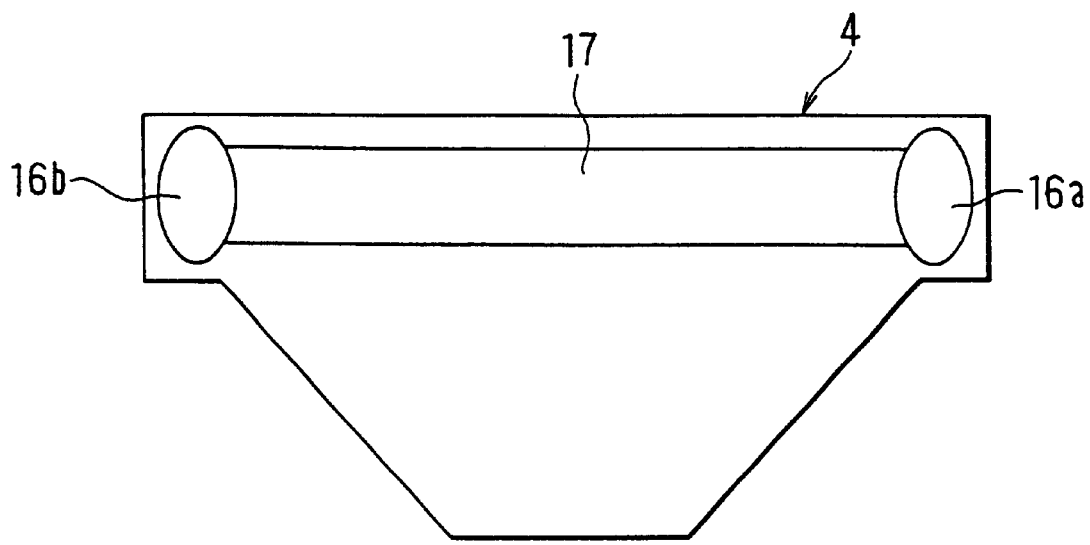
FIG. 32A is a front view showing modification 2 of the third embodiment.
Figure 32B:
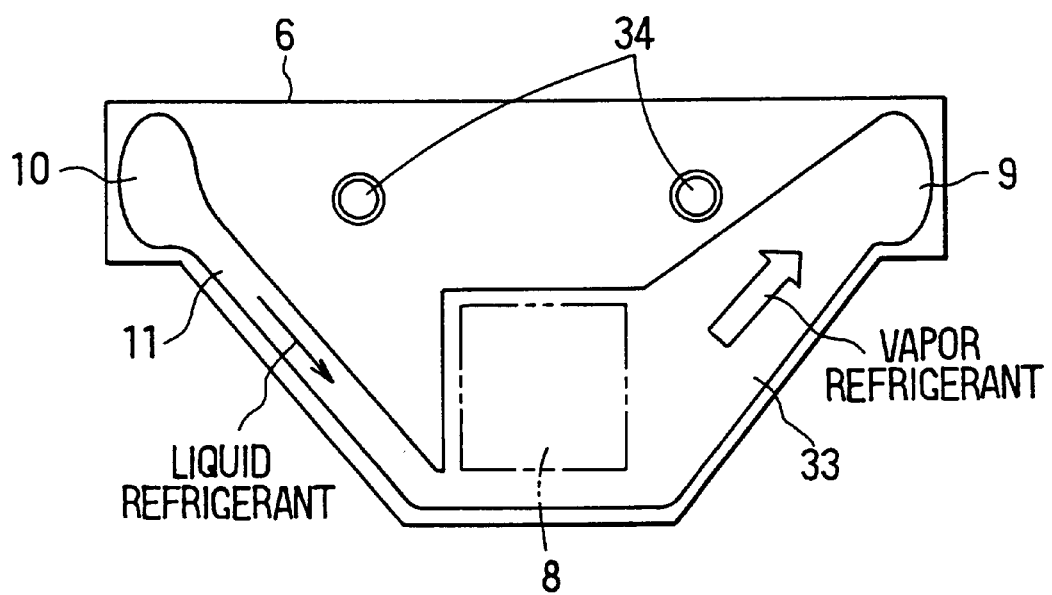
FIG. 32B is a plan view showing refrigerant paths in a refrigerant tank of modification 2 of the third embodiment.

The third embodiment described above may be modified in various forms. Some examples of the modification are shown in FIGS. 31A–33B. Modification 1 is shown in FIGS. 31A and 31B, in which a part of the trapezoidal case 6 is cut out, and the vapor passage 33 is bent about 90 degrees at the upper portion of the evaporating space 8. Thus, the interference between the liquid refrigerant and the vapor refrigerant is avoided. Other structures are the same as those of the third embodiment described above. Modification 2 is shown in FIGS. 32A and 32B, in which the vapor passage 33 extends straight from the evaporating space 8 toward the header-connecting portion 9, and no vapor passage is formed in a space above the evaporating space 8. Therefore, holes 34 for connecting the substrate 2 may be made in that space when they are needed. Modification 3 is shown in FIGS. 33A and 33B, in which the space above the evaporating space 8 is cut out to reduce the weight of the apparatus. Other structures are the same as those of the third embodiment.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A cooling apparatus using boiling and condensing refrigerant for cooling hot objects, the apparatus comprising:

a refrigerant tank containing the refrigerant therein and having a first surface and a second surface, the second surface including a heat-receiving surface on which the hot objects to be cooled are attached;

a radiator, connected to the first surface of the refrigerant tank, for cooling and condensing the refrigerant vaporized in the refrigerant tank by heat received from the hot objects, the radiator comprising a pair of header tanks inserted into the refrigerant tank, a plurality of tubes connected between the pair of header tanks and heat-radiating fins disposed between each pair of neighboring tubes; and means for restricting a length of header tank insertion into the refrigerant tank, so that a bottom fin closest to the refrigerant tank properly contacts the refrigerant tank without being deformed, wherein:

the restricting means is one or more spacers disposed between the header tanks and the refrigerant tank.

2. The cooling apparatus as in claim 1, wherein:

the spacer is disposed between a shoulder formed on the header tanks and an upper surface of the refrigerant tank.

3. The cooling apparatus as in claim 1, wherein:

the spacer is disposed between a shoulder formed on the header tanks and a bottom wall of the refrigerant tank.

4. The cooling apparatus as in claim 1, wherein:

the spacer is disposed between a bottom end of the header tanks and a bottom wall of the refrigerant tank.

5. The cooling apparatus as in claim 1, wherein:

the spacer is formed integrally with the refrigerant tank.

6. The cooling apparatus as in claim 1, wherein:

the refrigerant tank includes a cover plate forming the first surface; and the cover plate includes stay portions extended beyond an upper and a bottom edge of the refrigerant tank, the stay portions being adapted to mount a substrate carrying the hot objects thereon.

7. The cooling apparatus as in claim 6, wherein:

the substrate carrying the hot objects is mounted on the stay portions with resiliency.

8. The cooling apparatus as in claim 6, wherein:

the hot objects are computer chips.

9. The cooling apparatus as in claim 6, wherein:

the cover plate further includes walls constituting a duct for leading fluid for cooling the radiator, the walls being integrally formed with the cover plate.

10. The cooling apparatus as in claim 1, wherein:

the refrigerant tank includes an evaporating space in which the refrigerant is evaporated by heat received from the hot objects, a vapor passage through which vapor refrigerant is transferred to the radiator and a liquid passage through which liquid refrigerant flows into the evaporating space;

the heat-receiving surface is elevated from the second surface; and an inlet of the liquid passage and an outlet of the vapor passage are connected by a curved path through the evaporating space, so that interference between both flows of liquid and vapor refrigerant is avoided.

11. The cooling apparatus as in claim 10, wherein:

the hot objects attached to the heat-receiving surface are computer chips.

12. The cooling apparatus as in claim 11, wherein:

an area of the heat-receiving surface is substantially equal to a surface area of the computer chips.

* * * * *